US012578363B2

(12) United States Patent
Liang et al.

(10) Patent No.: US 12,578,363 B2
(45) Date of Patent: Mar. 17, 2026

(54) DEVICE, METHOD AND SYSTEM TO SENSE VOLTAGES AT SAMPLE POINTS OF RESPECTIVE INTERCONNECT STRUCTURES

(71) Applicant: Intel Corporation, Santa Clara, CA (US)

(72) Inventors: Xiaoguo Liang, Shanghai (CN); Farzaneh Yahyaei-Moayyed, Chandler, AZ (US); Nazar Haider, Fremont, CA (US); Nishi Ahuja, Portland, OR (US); Jie Yan, Shanghai (CN); Julio C. Cinco Galicia, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 18/271,213

(22) PCT Filed: Jan. 6, 2021

(86) PCT No.: PCT/CN2021/070476
§ 371 (c)(1),
(2) Date: Jul. 6, 2023

(87) PCT Pub. No.: WO2022/147685
PCT Pub. Date: Jul. 14, 2022

(65) Prior Publication Data
US 2024/0069075 A1     Feb. 29, 2024

(51) Int. Cl.
*G01R 19/10* (2006.01)

(52) U.S. Cl.
CPC .................................. *G01R 19/10* (2013.01)

(58) Field of Classification Search
CPC ................ G01R 19/0038; G01R 19/10; G01R 19/16552; G01R 19/16528;
(Continued)

(56) References Cited

U.S. PATENT DOCUMENTS

| | | | |
|---|---|---|---|
| 7,427,872 B2 * | 9/2008 | Schoenborn | ............ H04L 25/45 |
| | | | 326/14 |
| 7,652,494 B2 * | 1/2010 | Dobberpuhl | ............ G06F 1/324 |
| | | | 324/750.3 |

(Continued)

FOREIGN PATENT DOCUMENTS

| | | |
|---|---|---|
| CN | 207895339 U | 9/2018 |
| WO | 2020/242654 A1 | 12/2020 |

OTHER PUBLICATIONS

European Search Report and Search Opinion, EP App. No. 21916743.4, Aug. 19, 2024, 9 pages.
(Continued)

*Primary Examiner* — Vinh P Nguyen
(74) *Attorney, Agent, or Firm* — NICHOLSON DE VOS WEBSTER & ELLIOTT LLP

(57) ABSTRACT

Techniques and mechanisms for sensing a voltage difference across two interconnect structures of a multi-chip packaged device. In an embodiment, the interconnect structures provide respective voltages to each of multiple integrated circuit (IC) chips of the packaged device. Switch circuitry of the packaged device is operable to provide any of multiple modes which each switchedly couple a voltage sensor to a different respective one of various sample point pairs of the interconnect structures. Control circuitry operates the switch circuitry to selectively provide one of the multiple modes based on an indication of a workload to be performed with one or more of the IC chips. In another embodiment, the voltage sensor senses the voltages each at a respective sample point of a sample point pair which corresponds to the selected mode of the switch circuitry.

20 Claims, 7 Drawing Sheets

(58) Field of Classification Search
CPC .... G01R 19/0084; G01R 19/00; G01R 31/28;
G01R 19/16566; G01R 31/52; G01R
31/2879; G01R 31/66; G01R 21/06;
G01R 31/54; G01R 31/2843; G01R
31/2637; G01R 31/00; G01R 31/68;
G01R 31/2896; G06F 13/4068
See application file for complete search history.

(56) References Cited

U.S. PATENT DOCUMENTS

| | | | |
|---|---|---|---|
| 9,804,207 B1 | 10/2017 | Lesea | |
| 11,402,409 B1 * | 8/2022 | McNally | G01R 15/207 |
| 11,422,201 B1 * | 8/2022 | Raschbacher | G01R 19/16552 |
| 2005/0046467 A1 * | 3/2005 | Kase | G05F 1/56 327/541 |
| 2007/0273353 A1 * | 11/2007 | Okamoto | G01R 31/3004 323/324 |
| 2008/0224684 A1 | 9/2008 | Sofer et al. | |
| 2019/0339309 A1 | 11/2019 | Jiang et al. | |
| 2020/0373286 A1 | 11/2020 | Dennis et al. | |

OTHER PUBLICATIONS

International Search Report and Written Opinion, PCT App. No.
PCT/CN2021/070476, Oct. 12, 2021, 6 pages.
Intention to Grant, EP App. No. 21916743.4, Nov. 6, 2025, 6 pages.

\* cited by examiner

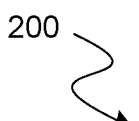

200

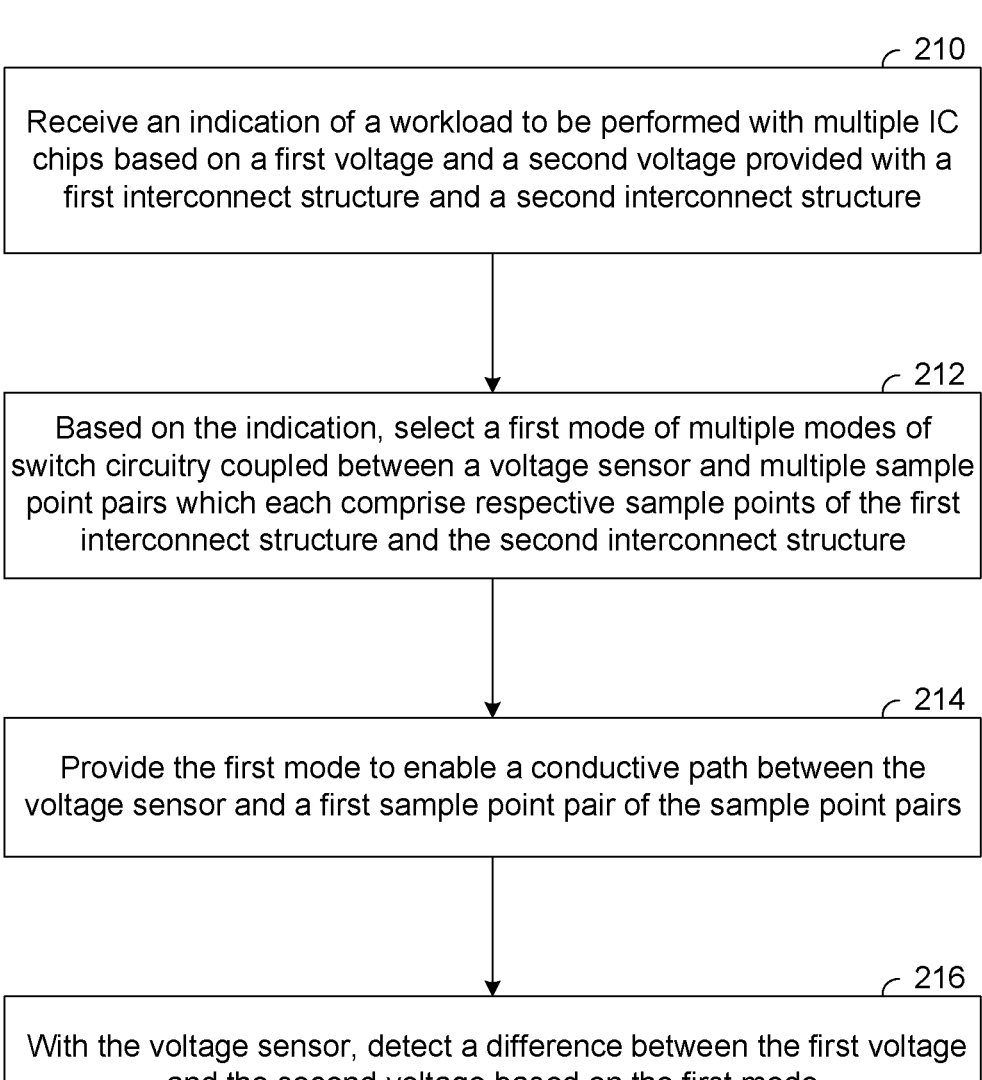

210

Receive an indication of a workload to be performed with multiple IC chips based on a first voltage and a second voltage provided with a first interconnect structure and a second interconnect structure

212

Based on the indication, select a first mode of multiple modes of switch circuitry coupled between a voltage sensor and multiple sample point pairs which each comprise respective sample points of the first interconnect structure and the second interconnect structure

214

Provide the first mode to enable a conductive path between the voltage sensor and a first sample point pair of the sample point pairs

216

With the voltage sensor, detect a difference between the first voltage and the second voltage based on the first mode

FIG. 2

DEVICE, METHOD AND SYSTEM TO SENSE VOLTAGES AT SAMPLE POINTS OF RESPECTIVE INTERCONNECT STRUCTURES

CROSS-REFERENCE TO RELATED APPLICATIONS

This application is a National stage of International Application No. PCT/CN2021/070476, filed Jan. 6, 2021, which is hereby incorporated by reference.

BACKGROUND

1. Technical Field

This disclosure generally relates to power management and more particularly, but not exclusively, to measuring voltage levels at various sample points of an interconnect structure.

2. Background Art

Advances in semiconductor processing and logic design have permitted an increase in the amount of logic that is present on integrated circuit (IC) devices. As a result, computer system configurations have evolved from a single or multiple integrated circuits in a system to multiple hardware threads, multiple cores, multiple devices, and/or complete systems on individual integrated circuits. Additionally, as the density of integrated circuits has grown, the power requirements for computing systems (from embedded systems to servers) have also escalated. Furthermore, software inefficiencies, and its requirements of hardware, have also caused an increase in computing device energy consumption. In fact, some studies indicate that computing devices consume a sizeable percentage of the entire electricity supply for a country, such as the United States of America. As a result, there is a vital need for energy efficiency and conservation associated with integrated circuits. These needs will increase as servers, desktop computers, notebooks, Ultrabooks™, tablets, mobile phones, processors, embedded systems, etc., become even more prevalent (from inclusion in the typical computer, automobiles, and televisions to biotechnology).

BRIEF DESCRIPTION OF THE DRAWINGS

The various embodiments of the present invention are illustrated by way of example, and not by way of limitation, in the figures of the accompanying drawings and in which:

FIG. 2 illustrates a flow diagram showing features of a method to determine a sampling of a voltage differential according to an embodiment.

DETAILED DESCRIPTION

Figure 1:
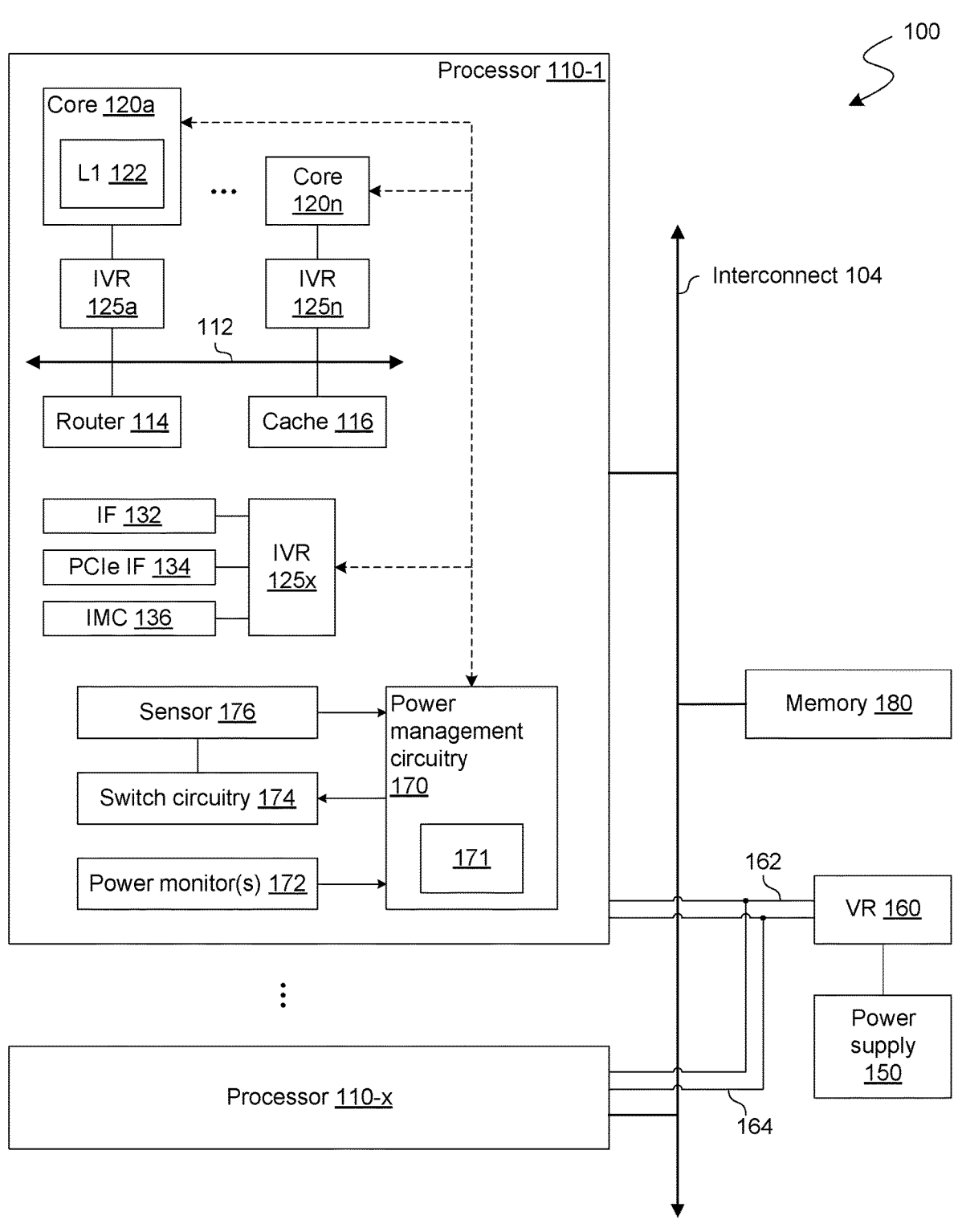
FIG. 1 illustrates a functional block diagram showing features of a system to sample voltages according to an embodiment.

Embodiments discussed herein variously provide techniques and mechanisms for sensing a voltage difference across any of multiple pairs of sample points in a packaged device. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a packaged device comprising multiple integrated circuit (IC) chips and switch circuitry which is operable to couple any of various pairs of sample points to a voltage sensor.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Certain features of various embodiments are described herein with respect to switch circuitry which is operable to provide any of multiple modes, where each such mode corresponds to a different respective sample point pair comprising a respective first sample point at a first interconnect structure, and a respective second sample point at a second interconnect structure. In various embodiments, the first interconnect structure and second interconnect structure are each to provide a different respective voltage (e.g., including voltages Vcc+, Vcc−, including voltages Vdd, Vss, or the like).

As used herein, "interconnect structure" refers to a contiguous body of one or more conductors—e.g., wherein the contiguous body omits any semiconductor material, or active circuit elements (and, in some embodiments, any passive circuit elements). In one example embodiment, an interconnect structure includes multiple conductors, each of which is electrically coupled directly to another one or more of the multiple conductors. For example, such an interconnect structure comprises a conductor which is electrically coupled between two or more IC chips—e.g., where the interconnect structure further comprises respective conductors of each of the two or more IC chips. An interconnect structure comprises, for example, any of various conductors including, but not limited to, one or more one or more conductive traces, vias, bond pads, pins, solder connections, wire bonds, microbumps and/or the like.

As used herein, "sample point" refers to a portion of a given interconnect structure, wherein circuitry according to various embodiments is coupled to enable a sensing of a voltage at said portion. The term "sample point pair" refers herein to two sample points which are each at a different respective interconnect structure—e.g., wherein circuitry according to various embodiments is coupled to enable a sensing of a difference between respective voltages at the two sample points. In some embodiments, a given two sample point pairs differ from each other with respect to at least one sample point.

In various embodiments, a given mode of switch circuitry switchedly couples two circuit resources (e.g., including a voltage sensor and a sample point) to each other. In this particular context, "switchedly couples," "switched coupling," "switchedly coupled," and related terms variously refer herein to the characteristic of switch circuitry being configured—e.g., in an on (closed) state—to enable at least in part a conductive path, via the switch circuitry in question, between the two circuit resources. By contrast, "switchedly decouples," "switched decoupling," "switchedly decoupled," and related terms variously refer herein to the characteristic of switch circuitry being alternatively configured—e.g., in an off (open) state—to disable a conductive path, via the switch circuitry in question, between the two circuit resources.

Some embodiments improve on previous techniques for monitoring power delivery in a multi-chip packaged device at least insofar as said embodiments variously facilitate analysis of whether and/or how a supply voltage, at a given time, exhibits variation at different locations of an interconnect structure—e.g., including a location between two IC chips, locations each at a different respective IC chip, different locations in the same IC chip, and/or the like. In enabling the sensing of voltage differentials across any of multiple sample point pairs (the pairs each including respective sample points of the same two interconnect structures), such embodiments variously enable an increased granularity with which power delivery in a multi-chip packaged device is to be evaluated. By way of illustration and not limitation, some embodiments variously enable the evaluation of power delivery at various levels including a package level, a level of an individual IC chip of the package, and a level of an individual component (e.g., a processor core) of one IC chip of the package.

FIG. 1 illustrates a block diagram of a computing system 100 to sample a level of a supply voltage according to an embodiment. System 100 is one example of an embodiment wherein switch circuitry is operable to selectively enable the sampling of a voltage level at any of multiple pairs of sample points of a voltage supply line.

As shown in FIG. 1, system 100 includes one or more processors 110-1, . . . , 110-x (generally referred to herein as "processors 110" or "processor 110"). The processors 110 are coupled to communicate via a bus or other interconnect 104. Each processor includes various components some of which are only discussed with reference to processor 110-1 for clarity. Accordingly, some or all remaining processors include the same or similar components discussed with reference to the processor 110-1.

Some or all of processors 110 each include respective circuit resources which are variously coupled each to receive a supply voltage via an interconnect structure, wherein switch circuitry of system 100 is operable to facilitate sampling of a level of the supply voltage at any of multiple different points of the interconnect structure. In the example embodiment shown, processor 110-1 includes one or more processor cores 120a, . . . , 120n (referred to herein as "cores 120," or "core 120"), a cache 116, and/or a router 114. The processor cores 120 are implemented on a single integrated circuit (IC) chip which, for example, is coupled to another IC chip which includes processor 110-x.

As seen, processor 110-1 is a single chip processor including multiple cores 120a-120n. In addition, cores 120 are associated each with a respective one of integrated voltage regulator (IVR) 125a-125n which (for example) receives the primary regulated voltage and generates an operating voltage to be provided to one or more agents of the processor associated with the IVR. Accordingly, an IVR implementation is provided to allow for fine-grained control of voltage and thus power and performance of individual cores. As such, multiple cores are each able to operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. During power management, a given power plane of one IVR is powered down or off when a processor is placed into a certain low power state, while another power plane of another IVR remains active, or fully powered. In other embodiments, processors 110-1, . . . , 110-x omits some or all IVRs—e.g., wherein one or more of processor core 120a, . . . , 120n receive a voltage from a centralized voltage regulator (e.g., VR 160) which, for example, is on a motherboard or other printed circuit board.

In various embodiments, processor 110-1 includes one or more shared and/or private caches (such as cache 116), buses or interconnections (such as a bus or other interconnect 112), graphics and/or memory controllers, or other components. In one embodiment, the router 114 is used to communicate between various components of the processor 110-1 and/or system 100. Moreover, the processor 110-1 includes more than one router 114. Furthermore, the multitude of routers 114 are in communication to enable data routing between various components inside or outside of the processor 110-1.

The cache 116 stores data (e.g., including instructions) that are utilized by one or more components of the processor 110-1, such as the cores 120. For example, the cache 116 locally caches data stored in a memory 180 for faster access by the components of the processor 110 (e.g., faster access by cores 120). As shown in FIG. 1, the memory 180 communicates with the processors 110 via the interconnect 104. In an embodiment, the cache 116 (that is shared) is a mid-level cache (MLC), a last level cache (LLC), etc. Also, each of the cores 120 includes a level 1 (L1) cache (122) (generally referred to herein as "L1 cache 122") or other levels of cache such as a level 2 (L2) cache. Moreover, various components of the processor 110-1 communicate with the cache 116 directly, through a bus (e.g., the interconnect 112), and/or a memory controller or hub.

Still referring to FIG. 1, additional components of processor 110-1 include (for example) an input/output interface 132, another interface 134, and an integrated memory controller (IMC) 136. As seen, each of these components is powered by another integrated voltage regulator 125x. In one embodiment, interface 132 enables operation for an Intel® Quick Path Interconnect (QPI) interconnect, which provides for point-to-point (PtP) links in a cache coherent protocol that includes multiple layers including a physical layer, a link layer and a protocol layer. In turn, interface 134 communicates via a Peripheral Component Interconnect Express (PCIe™) protocol.

The system 100 also includes a power supply 150—e.g., a direct current (DC) power source or an alternating current (AC) power source—to provide power to one or more components of the system 100. In some embodiments, the power supply 150 includes one or more battery packs. The power supply 150 is coupled to components of system 100 through a voltage regulator (VR) 160. For example, processors 110 are variously coupled to a power supply 150 via an external voltage regulator 160, which performs a first voltage conversion to provide a primary regulated voltage to processor 110. Moreover, even though FIG. 1 illustrates one power supply 150 and one voltage regulator 160, additional power sources and/or voltage regulators are utilized. For example, in some embodiments, each of the processors 110 has corresponding voltage regulator(s) and/or power source(s). Alternatively or in addition, one or more voltage regulators are coupled to a single power plane (e.g., supplying power to all the cores 120) or to multiple power planes (e.g., where each power plane supplies power to a different core or group of cores).

Additionally, while FIG. 1 illustrates the power supply 150 and the voltage regulator 160 as separate components, in other embodiments, the power supply 150 and the voltage regulator 160 are incorporated into other components of system 100. For example, all or portions of the VR 160 are alternatively incorporated into the power supply 150 and/or processor 110.

As shown in FIG. 1, the processor 110 further includes a power management circuitry 170 to control supply of power to components of the processor 110 (e.g., including cores 120). Power management circuitry 170 includes or otherwise has access to one or more storage devices to store information (such as the illustrative reference information 171 shown) relating to operations of power management circuitry 170 such as information communicated with various components of system 100 as discussed here. As shown, the power management circuitry 170 is coupled to the VR 160 and/or other components of system 100 (such as the cores 120).

In an embodiment, power management circuitry 170 comprises hardware, software and/or firmware to perform power management operations with regard to processor 110-1 and/or one or more other processors of system 100. As seen, power management circuitry 170 provides control information to external voltage regulator 160 via a digital interface to cause the voltage regulator to generate the appropriate regulated voltage. Power management circuitry 170 also provides control information to one or more IVRs via another digital interface to control the operating voltage generated (or to cause a corresponding IVR to be disabled in a low power mode). In various embodiments, power management circuitry 170 includes a variety of power management logic units to perform hardware-based power management. In various embodiments, such power management is wholly processor controlled (e.g., by various processor hardware, and which is triggered by workload and/or power, thermal or other processor constraints) and/or the power management is performed responsive to external sources (such as a platform or management power management source or system software). As described further herein, power management circuitry 170 includes control logic to perform a workload classification based on a type of workload being executed, and cause the workload to be executed on a potentially different number of cores (and at potentially different performance states) based at least in part on the workload type.

In some embodiments, the power management circuitry 170 is coupled to receive information, e.g., in the form of one or more bits or signals, to indicate status of one or more sensors 176. In one such embodiment, sensor(s) 176 are provided proximate to components of system 100, such as the cores 120, interconnects 104 or 112, etc., to sense one or more characteristics of a voltage, temperature, operating frequency, power consumption, inter-core communication activity, etc. Additionally, or alternatively, power management circuitry 170 is coupled to receive information from one or more power monitors 172 which, for example, indicate the operational status of various components of system 100 such as operating temperature, operating frequency, operating voltage, operating status (e.g., active or inactive), power consumption (instantly or over a period of time), etc.). Based on such information, power management circuitry 170 instructs the VR 160, power supply 150, and/or individual components of system 100 (such as the cores 120) to modify their operations. For example, power management circuitry 170 indicates to the VR 160 and/or power supply 150 to adjust their output. In some embodiments, power management circuitry 170 requests the cores 120 to modify their operating frequency, power consumption, etc. Even though power management circuitry 170, power monitors 172, and sensors 176 are shown to be included in processor 110-1, these components are provided elsewhere in the system 100. For example, power management circuitry 170 is provided in the VR 160, in the power supply 150, directly coupled to the interconnect 104, within one or more (or alternatively all) of the processors 110, etc.

In various embodiments, system 100 comprises a packaged device, wherein multiple IC chips of the packaged device are each coupled to receive, with a first interconnect structure and a second interconnect structure, both a first voltage and a second voltage (respectively). For example, processors 110-1, . . . , 110-x (and/or other such circuit resources of the packaged device) are variously implemented each with a respective one of the multiple IC chips. The first interconnect structure and the second interconnect structures variously extend to couple to each of the multiple IC chips—e.g., wherein the multiple IC chips each include respective portions of the first interconnect structure and the second interconnect structures.

In one such embodiment, the packaged device is coupled to (or alternatively, includes) VR 160, which provides power to processors 110-1, . . . , 110-x via interconnect structures 162, 164. By way of illustration and not limitation, interconnect structure 162 provides the first voltage or, alternatively, another voltage with which other voltage regulator circuitry of the packaged device generates the first voltage. For example, the first interconnect structure includes interconnect structure 162, or is otherwise coupled provide the first voltage based on a voltage that VR 160 provides via interconnect structure 162. Alternatively or in addition, interconnect structure 164 provides the second voltage or, alternatively, another voltage with which other voltage regulator circuitry of the packaged device generates the second voltage. For example, the second interconnect structure includes interconnect structure 164, or is otherwise coupled to provide the second voltage based on another voltage that VR 160 provides via interconnect structure 164.

In various embodiments, the first interconnect structure and the second interconnect structures each include various sample points, wherein multiple sample point pairs each include a respective first sample point of the first interconnect structure and a respective second sample point of the second interconnect structure. In one such embodiment, switch circuitry 174 is variously coupled between sensor 176 and said multiple sample point pairs—e.g., wherein switch circuitry 174 is operable to be configured into any of multiple modes which each switchedly couple sensor 176 to a different respective sample point pair.

Power management circuitry 170 (or other suitably configured controller circuitry of the packaged device) is coupled to control switch circuitry 174 to provide such a mode—e.g., in response to an indication of a particular workload to be performed with the multiple IC chips. For example, switch circuitry 174 is operable to provide, for different workloads of the multiple IC chips, a corresponding one or more of the modes. During a given one of said modes, sensor 176 senses a difference (across a corresponding sample point pair) between the first voltage and the second voltage. In one such embodiment, the voltage difference sensed by sensor 176 is evaluated (e.g., based on a threshold voltage level which corresponds to the sample point pair) to detect whether one or more power delivery criteria have been (or will be) satisfied.

FIG. 2 illustrates operations of a method 200 to determine a sampling of a voltage differential at a packaged device according to an embodiment. Method 200 is one example of an embodiment wherein switch circuitry is configured to selectively provide one of multiple available modes, some or all of which each correspond to a different respective pair of sample points of two interconnect structures. For a given one of said modes, the mode switchedly couples the corresponding sample pair to a voltage sensor and, for example, decouples one or more other sample pairs from the voltage sensor. In some embodiments, method 200 is performed with circuitry of system 100—e.g., the circuitry including power management circuitry 170 and/or switch circuitry 174.

As shown in FIG. 2, method 200 comprises (at 210) receiving an indication of a workload to be performed with multiple IC chips (which, for example, each include a respective one of processors 110-1, . . . , 110-x). The workload is to be performed based on a first voltage and a second voltage which are provided, via a first interconnect structure and a second interconnect structure (respectively) to each of the multiple IC chips. In an embodiment, the packaged device includes (or alternatively, is coupled to) a voltage sensor, wherein switch circuitry is coupled between said voltage sensor (e.g., sensor 176) and multiple sample point pairs. The sample point pairs each comprise a respective first sample point of the first interconnect structure, and a respective second sample point of the second interconnect structure.

By way of illustration and not limitation, in some embodiments, one or each sample point of one such sample point pair is outside of each of the multiple IC chips. Alternatively, or in addition, one such sample point pair is at a first IC chip of the multiple IC chips—e.g., wherein another such sample point pair is at a second IC chip of the multiple IC chips. Alternatively, or in addition, two or more of the sample point pairs are each at the same IC chip of the multiple IC chips, in some embodiments.

In various embodiments, the multiple IC chips comprise a first IC chip and a second IC chip, wherein the first IC chip, in turn, comprises a processor including multiple processor cores. In one such embodiment, the sample point pairs comprise a first sample point pair which is at the first IC chip, wherein one or each sample point of the first sample point pair is coupled between the second IC chip and each processor core of the first IC chip. Alternatively or in addition, the sample point pairs comprise a second sample point pair, wherein one or each sample point of the second sample point pair is coupled between two processor cores of the first IC chip. For example, in some embodiments, some or all such processor cores are arranged in an array, wherein the two processor cores are in different respective rows of the array, and are each in the same column at an edge of the array. Alternatively, one or each sample point of the second sample point pair (or of another sample point pair), are coupled between two processor cores which are in the same row of the array. Alternatively or in addition, a row of the array comprises a first core, a second core, and a third code, wherein the first core is between the second core and the third core. In one such embodiment, the first interconnect structure (for example) comprises a first portion coupled between the second core and a third core, and a second portion which branches from the first portion and extends toward the first core. In one such embodiment, one of the sample point pairs comprise a respective first sample point which is at the second portion.

Alternatively or in addition, the sample point pairs comprise a third sample point pair which is at the second IC chip, wherein one or each sample point of the third sample point pair is coupled between the first IC chip and each processor core (if any) of the second IC chip. Alternatively or in addition, the sample point pairs comprise a fourth sample point pair, wherein one or each sample point of the fourth sample point pair is coupled between two processor cores of the second IC chip.

Method 200 further comprises (at 212) selecting a first mode of multiple modes which are available to be provided with the switch circuitry (such as switch circuitry 174). In various embodiments, the multiple modes are each to switchedly couple the voltage sensor to a different respective one (and, for example, only one) of the sample point pairs.

The receiving at 210 and/or the selecting at 212 is performed, for example, with power monitors 172, with power management circuitry 170 and/or with any of a variety of other circuit resources which are suitable to provide, or otherwise operate based on, performance monitoring functionality. By way of illustration and not limitation, power management circuitry 170 (or, alternatively, one of power monitors 172) includes, has access to, or otherwise operates based on, some predetermined reference information 171 which specifies or otherwise indicates criteria for identifying a given workload as belonging to a particular one of various classes of workloads. For example, such reference information 171 identifies a given workload class as corresponding to a number of processor cores to be allocated, a number and/or type of one or more software threads to be executed, a required level of power consumption, a required processor frequency, or the like. Additionally or alternatively, the reference information 171 specifies or otherwise indicates, for each of various workload classes, a corresponding one or more sample point pairs for which voltage measuring is to take place. In one such embodiment, the reference information 171 indicates, for a given workload class, a corresponding sequence of two or more sample point pairs, wherein, according to the sequence, corresponding modes are to be successively provided with the switch circuitry, and voltage samples are to be successively taken each during a respective one of the corresponding modes.

Such reference information is generated or otherwise provided, for example, by any of various suitable agents including, but not limited to, a commercial entity (e.g., including manufacturer, distributor, retailer or the like), a system administrator, a computer user, performance management software, or the like. Some embodiments are not limited with respect to the particular source form which, or means by which, such reference information is made available for use at a package device during method 200. Moreover, some embodiments are not limited with respect to a particular number and/or type of workload classes to be indicated by such reference information, or to a particular one or more sample points (and/or a particular switch mode) which is to correspond to a given workload class.

Method 200 further comprises (at 214) providing the first mode, which is selected at 212, to enable a conductive path between the voltage sensor and a first sample point pair of the sample point pairs. For example, the providing at 214 comprises power management circuitry 170 variously operating one or more transistors and/or other such circuits of switch circuitry 174 to provide conductive paths each between sensor 176 and a different respective sample point by which a corresponding voltage is supplied to circuitry of processors 110-1, . . . , 110-x. Method 200 further comprises (at 216) detecting a difference between the first voltage and the second voltage, with the voltage sensor, based on the first mode which is provided at 214.

In various embodiments, method 200 further comprises additional operations (not shown) which, for example, facilitate one or more other voltage sensing operations each based on a respective other workload and a corresponding one of the sample point pairs. By way of illustration and not limitation, such additional operations comprise receiving another indication of a different workload to be performed with the multiple IC chips based on the first voltage and the second voltage—e.g., wherein the indication is communicated from one of power monitors 172 to power management circuitry 170. Based on said other indication, a second mode of the multiple modes is selected and provided with the switch circuitry. Based on the provided second mode, the voltage sensor then detects a second difference, across a different sample point pair, between the first voltage and the second voltage. In one such embodiment, the additional operations of method 200 further comprise performing a first evaluation, based on a first threshold voltage level, of the difference which is detected at 214. By contrast, a second evaluation, of the second difference between the first voltage and the second voltage, is performed based on a second threshold voltage level other than the first threshold voltage level.

Figure 3:
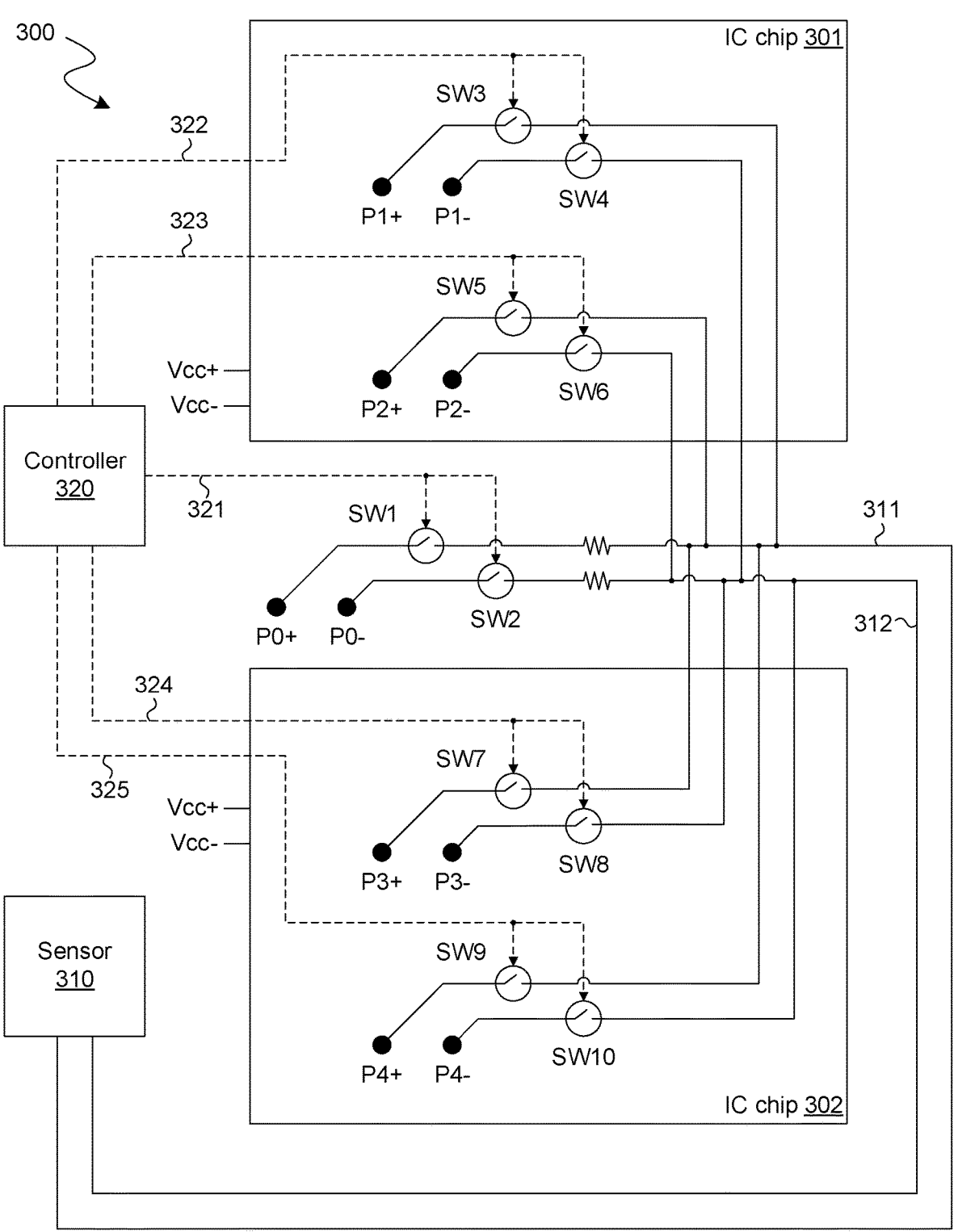
FIG. 3 illustrates a functional block diagram showing features of a packaged device to sense voltage differences across various pairs of sample points according to an embodiment.

FIG. 3 illustrates features of a packaged device 300 to determine the sampling of voltages at different respective sample points of an interconnect structure according to an embodiment. Packaged device 300 is one example of an embodiment wherein interconnect structures are coupled to provide respective supply voltages to multiple IC chips, and wherein switch circuitry is operable to variously couple a voltage sensor to any of multiple different sample points of the interconnect structures. In one embodiment, packaged device 300 provides functionality such as that of system 100—e.g., wherein one or more operations of method 200 are performed with packaged device 300.

As shown in FIG. 3, packaged device 300 comprises multiple IC chips (including the illustrative IC chips 301, 302 shown) which—for example—variously provide functionality such as that of processors 110-1, . . . , 110-x. Operations of IC chips 301, 302 are powered with voltages which, for example, are variously provided with power supply 150, VR 160, power management circuitry 170 and/or the like.

For example, packaged device 300 comprises a first interconnect structure and a second interconnect structure (not shown) which variously extend to, and between, IC chips 301, 302—e.g., wherein the first and second interconnect structures are variously coupled each to provide a different respective one of a first supply voltage or a second supply voltage. In the example embodiment of packaged device 300, the first supply voltage and the second supply voltage are represented as Vcc+ and Vcc−, respectively—e.g., where Vcc− is a ground voltage or other reference potential.

In an illustrative scenario according to one embodiment, the first interconnect structure comprises first sample points P0+, P1+, P2+, P3+, P4+—e.g., wherein sample points P1+, P2+ are at IC chip 301, whereas sample points P3+, P4+ are at IC chip 302, and sample point P0+ is outside of IC chips 301, 302. In one such embodiment, the second interconnect structure comprises second sample points P0−, P1−, P2−, P3−, P4−—e.g., wherein sample points P1−, P2− are at IC chip 301, whereas sample points P3−, P4− are at IC chip 302, and sample point P0− is outside of IC chips 301, 302. In various embodiments, one or more such sample points (e.g., including sample points P0+, P0−) are each at a respective location which is external to any IC chip of packaged device 300.

Packaged device 300 further comprises—or alternatively, is coupled to operate with—a voltage sensor 310 (e.g., sensor 176) which facilitates a measurement of a voltage difference across respective sample points of the first interconnect structure and the second interconnect structure. In one such embodiment, switch circuitry of packaged device 300 (e.g., including switch circuitry 174) is coupled between sensor 310 and said sample points. By way of illustration and not limitation, packaged device 300 comprises switch circuits SW1 through SW10 which are operable to variously provide switched coupling each between sensor 310 and a different respective sample point of the first sample points and the second sample points. In an embodiment, IC chips 301, 302 each include a respective one or more of switches SW1 through SW10.

In an embodiment, a controller 320 of packaged device 300 (the controller 320 implemented, for example, at power management circuitry 170) comprises circuitry to communicate one or more signals—e.g., including the illustrative control signals 321-325 shown—to selectively enable the sampling of a voltage differential across any sample point pair of multiple sample point pairs. In the example embodiment shown, said multiple sample point pairs comprise sample point pairs (P0+, P0−), (P1+, P1−), (P2+, P2−), (P3+, P3−), (P4+, P4−). Such selective sampling is facilitated, for example, by an interconnect 311 which is coupled between sensor 310 and each of switches SW1, SW3, SW5, SW7, SW9—e.g., where another interconnect 312 is coupled between sensor 310 and each of switches SW2, SW4, SW6, SW8, SW10.

Controller 320 is operable to provide, at various times, any of multiple modes of the switch circuitry—e.g., where some or all such modes each correspond to a different respective sample point pair for which the mode enables voltage sampling. In an embodiment, a given one of said modes enables sensor 310 to perform voltage sampling across only the corresponding sample pair. By way of illustration and not limitation, controller 320 communicates one or more of control signals 321-325 to provide a mode of switch circuits SW1 through SW10 which enables sensor 310 to perform voltage sampling across one of the sample point pairs (P0+, P0−), (P1+, P1−), (P2+, P2−), (P3+, P3−), (P4+, P4−), where said mode disables voltage sampling by sensor 310 across any other of the sample point pairs (P0+, P0−), (P1+, P1−), (P2+, P2−), (P3+, P3−), (P4+, P4−).

By way of illustration and not limitation, a first switch mode provides, with switch circuits SW1, SW2, conductive paths each between sensor 310 and a different respective sample point of the sample point pair (P0+, P0−) outside of IC chips 301, 302. Alternatively or in addition, a second switch mode provides, with switch circuits SW3, SW4, conductive paths each between sensor 310 and a different respective sample point of the sample point pair (P1+, P1−) at IC chip 301. Alternatively or in addition, a third switch mode provides, with switch circuits SW5, SW6, conductive paths each between sensor 310 and a different respective sample point of the sample point pair (P2+, P2−) at IC chip 301. Alternatively or in addition, a fourth switch mode provides, with switch circuits SW7, SW8, conductive paths each between sensor 310 and a different respective sample point of the sample point pair (P3+, P3−) at IC chip 302. Alternatively or in addition, a fifth switch mode provides, with switch circuits SW9, SW10, conductive paths each between sensor 310 and a different respective sample point of the sample point pair (P4+, P4−) at IC chip 302

In various embodiments, controller 320 is coupled to receive a signal (not shown)—e.g., from performance monitoring logic provided, for example, with power management circuitry 170—which specifies or otherwise indicates a workload which is to be performed with some or all IC chips of packaged device 300. Based on the indicated workload, controller 320 selects a given one of multiple possible modes to be provided with switch circuits SW1 through SW 10. Based on such selection, controller 320 signals the switch circuitry to provide the mode in question, wherein—during the mode—voltage sensor 310 is to detect a voltage difference across the corresponding sample point pair.

In one such embodiment, the selecting of a particular switch mode to be configured is based on controller 320 identifying an indicated workload as belonging to a particular workload class which (according to some predetermined reference information, for example) corresponds to the switch mode. Based on the identified workload class, controller 320 configures the corresponding mode with some or all of control signals 321-325.

In one such embodiment, controller 320 includes, has access to, or otherwise operates based on reference information which identifies a given workload class as corresponding to a sequence of two or more modes of switch circuits SW1 through SW10. In response to an indication that a workload of packaged device 300 is of that given workload class, controller 320 variously configures some or all of switch circuits SW1 through SW10 to successively provide the two or more modes according to the sequence. During each of the two or more modes, voltage sensor 310 detects a respective voltage differential at a corresponding one of the sample point pairs (P0+, P0−), (P1+, P1−), (P2+, P2−), (P3+, P3−), (P4+, P4−).

Figure 4:
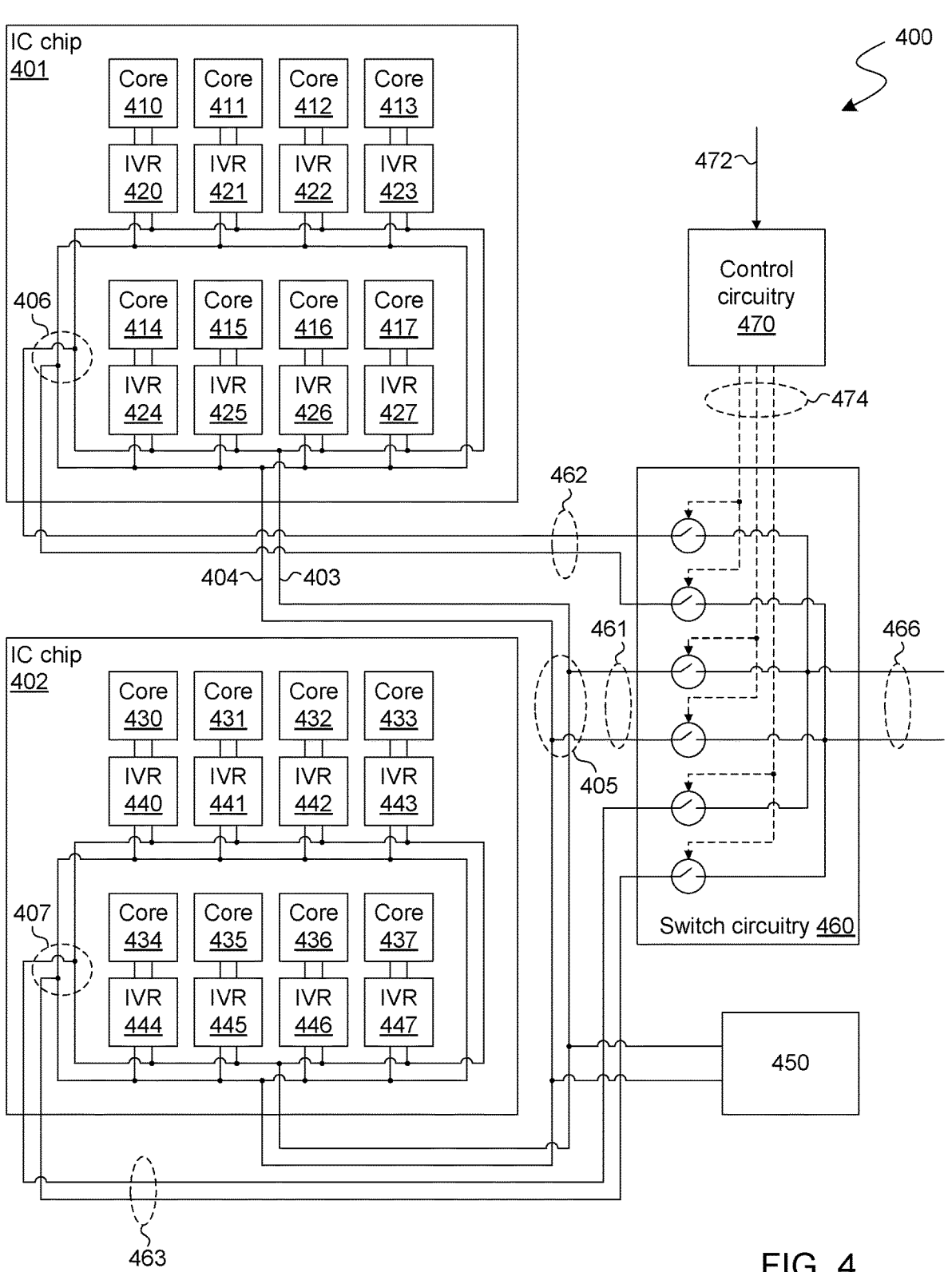
FIGS. 4 and 5 illustrate functional block diagrams each showing features of a respective packaged device to sample voltages according to a corresponding embodiment.

FIG. 4 illustrates features of a packaged device 400 to determine the sampling of a voltage differential according to an embodiment. Packaged device 400 is one example of an embodiment wherein circuitry of a packaged device facilitates multiple levels of voltage sampling across two interconnect structures—e.g., the multiple levels including package level sampling, and chip level sampling. In one embodiment, packaged device 400 provides functionality of system 100 or packaged device 300—e.g., wherein one or more operations of method 200 are performed with circuitry of packaged device 400.

As shown in FIG. 4, packaged device 400 comprises multiple IC chips (e.g., including the illustrative IC chips 401, 402 shown), wherein interconnect structures 403, 404 of packaged device 400 variously extend between (and, for example, in) each of said multiple IC chips. Interconnect structures 403, 404 are configured to provide to IC chips 401, 402 a first voltage and a second voltage, respectively—e.g., where packaged device 400 further comprises (or alternatively, is to couple to) a regulator 450 which supplies said first and second voltages to interconnect structures 403, 404.

In various embodiments, packaged device 400 is to couple to—or, for example, includes—a voltage sensor (not shown) which receives sampled voltages via switch circuitry 460 and lines 466 of packaged device 400. For example, switch circuitry 460 is variously coupled between lines 466 and multiple sample point pairs including (for example) the illustrative sample point pairs 405, 406, 407 shown. The sample point pairs 405, 406, 407 each include a respective first sample point of interconnect structure 403, and a respective second sample point of interconnect structure 404.

By way of illustration and not limitation, lines 461 of packaged device 400 are each coupled between a different respective sample point of sample point pair 405 and a corresponding switch of switch circuitry 460. Additionally or alternatively, lines 462 of packaged device 400 are each coupled between a different respective sample point of sample point pair 406 and a corresponding switch of switch circuitry 460—e.g., wherein lines 463 of packaged device 400 are each coupled between a different respective sample point of sample point pair 407 and a corresponding switch of switch circuitry 460. Although switch circuitry 460 is shown as being distinct from IC chips 401, 402, in certain embodiments, some or all switches of switch circuitry 460 are variously implemented each at a respective one of IC chips 401, 402—e.g., wherein some or all of lines 405, lines 406, and/or lines 407 are also provided each at a respective one of IC chips 401, 402.

Switch circuitry 460 is operable to provide any of various switched modes, including multiple modes which each correspond to a different respective one of sample point pairs 405, 406, 407. During a given one of said multiple modes, switch circuitry 460 switchedly couples the sample points of the corresponding sample point pair each to the voltage sensor via a different respective one of lines 466. By way of illustration and not limitation, a first mode of switch circuitry 460 switchedly couples sample point pair 405 (and lines 461) to lines 466—e.g., while sample point pair 406 and lines 462 are switchedly decoupled from lines 466, and sample point pair 407 and lines 463 are switchedly decoupled from lines 466. Additionally or alternatively, a second mode of switch circuitry 460 switchedly couples sample point pair 406 (and lines 462) to lines 466—e.g., while sample point pair 405 and lines 461 are switchedly decoupled from lines 466, and sample point pair 407 and lines 463 are switchedly decoupled from lines 466. Additionally or alternatively, a third mode of switch circuitry 460 switchedly couples sample point pair 407 (and lines 463) to lines 466—e.g., while sample point pair 405 and lines 461 are switchedly decoupled from lines 466, and sample point pair 406 and lines 462 are switchedly decoupled from lines 466, By way of illustration and not limitation, IC chips 401, 402 correspond functionally to IC chips 301, 302 (for example)—e.g., wherein IC chips 401, 402 each include a respective one of processors 110-1, . . . , 110-n. In one such embodiment, interconnect structures 403, 404 correspond functionally to interconnect structures 162, 164 (respectively)—e.g., wherein sample point pair 405 corresponds functionally to sample point pair (P0+, P0−), where sample point pair 406 corresponds functionally to one of sample point pairs (P1+, P1−), (P2+, P2−), and where sample point pair 407 corresponds functionally to one of sample point pairs (P3+, P3−), (P4+, P4−).

Controller circuitry 470 of packaged device 400 is coupled to provide control signals 474 which selectively configure a given one of the multiple modes of switch circuitry 460. In an embodiment, control signals 474 are generated based on control circuitry 470 receiving an indication (e.g., via signal 472) of a workload to be performed with one or both of IC chips 401, 402 based on the first voltage and the second voltage. Although control circuitry 470 is shown as being distinct from IC chips 401, 402, in other embodiments, some or all of control circuitry 470 is implemented with circuitry of one or more of IC chips 401, 402.

In the example embodiment shown, IC chip 401 comprises a first processor which includes processor cores 410 through 417, and integrated voltage regulators IVR 420 through IVR 427 which are each coupled between interconnect structures 403, 404 and a different respective one of cores 410 through 417. Alternatively or in addition, IC chip 402 comprises a second processor which includes processor cores 430 through 437, and integrated voltage regulators IVR 440 through IVR 447 which are each coupled between interconnect structures 403, 404 and a different respective one of cores 430 through 437. In one such embodiment, cores 410 through 417 (or cores 420 through 427) correspond functionally to cores 120$a$, . . . , 120$n$—e.g., wherein IVRs 420-427 (or IVRs 440-447) correspond functionally to IVRs 125$a$, . . . , 125$n$.

In various embodiments, packaged device 400 comprises one or more sample point pairs which are external to (e.g., between) two IC chips, and/or one or more sample point pairs which are each at a respective IC chip. In one such embodiment, a given IC chip comprises two or more sample point pairs, and/or multiple IC chips each include a respective one or more sample point pairs.

By way of illustration and not limitation, sample point pair 405 comprises sample points—each at a different respective one of interconnect structures 403, 404—which are between IC chips 401, 402 (e.g., wherein said sample points are outside of any IC chip of packaged device 400). Additionally or alternatively, sample point pair 406 comprises sample points which are each at IC chip 401. In the example embodiment shown, cores 410-417 are arranged in an array—e.g., wherein a first row of the array comprises cores 410-413, and a second row of the array comprises cores 414-417. In one such embodiment, one or each sample point of sample point pair 406 is coupled between two cores of the array (for example, cores 410, 414)—e.g., wherein the two cores are in different respective rows of the array, and are each in a column at an edge of the array.

Additionally or alternatively, sample point pair 407 comprises sample points which are each at a IC chip 402. In the example embodiment shown, cores 430-437 are arranged in an array—e.g., wherein one row of the array comprises cores 430-433, and another row of the array comprises cores 434-437. In one such embodiment, one or each sample point of sample point pair 407 is coupled between two cores of the array (for example, cores 430, 434)—e.g., wherein the two cores are in different respective rows of the array, and are each in a column at an edge of the array. The particular number and arrangement of sample point pairs 405, 406, 407—e.g., with respect to each other, with respect to cores 410-417 and/or with respect to cores 430-437—is merely illustrative, and not limiting on various embodiments.

Figure 5:
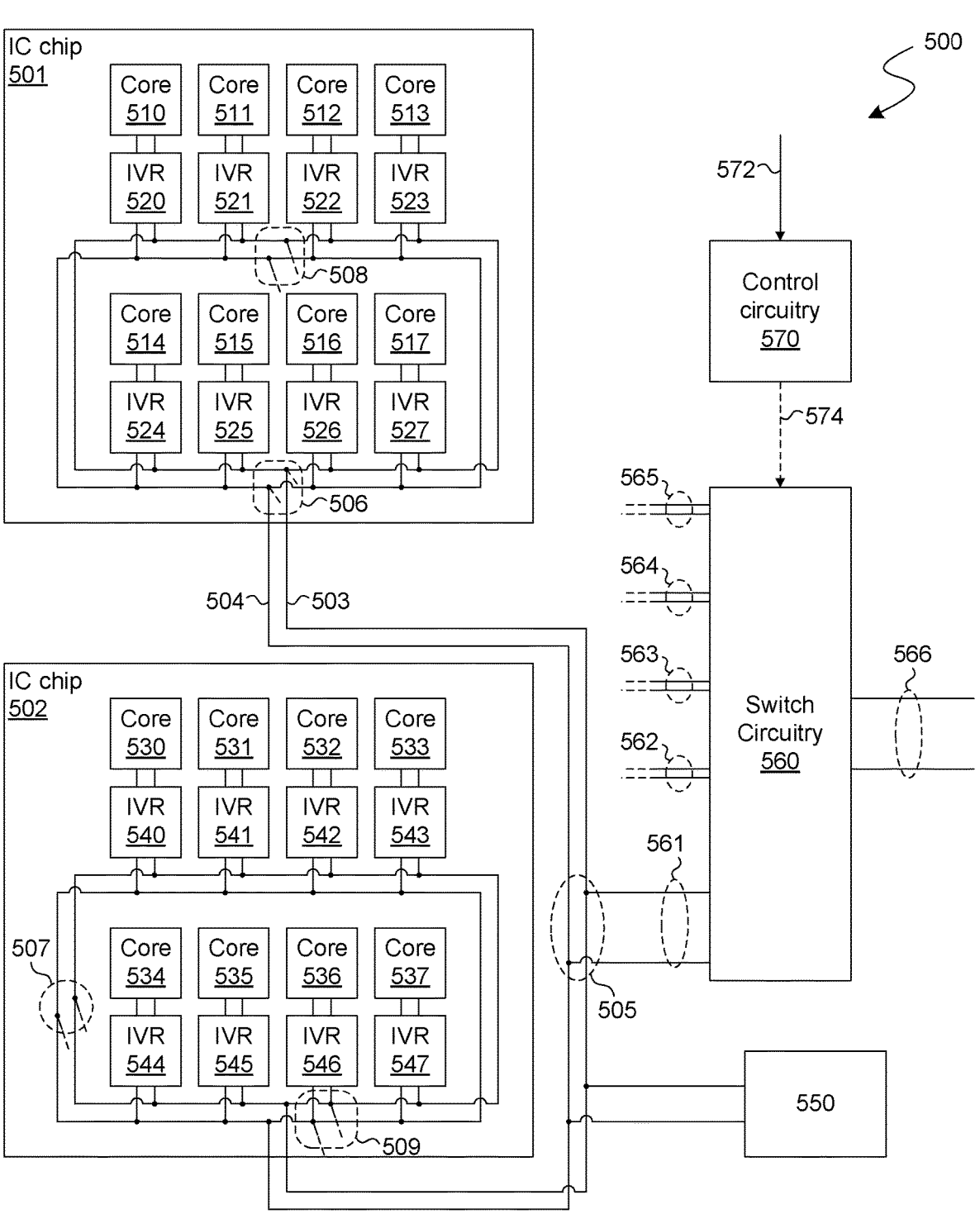

FIG. 5 shows features of a packaged device 500 to determine the sampling of a voltage differential according to another embodiment. Packaged device 500 illustrates one of various embodiments which facilitate multiple levels of voltage sampling across two interconnect structures—e.g., the multiple levels including package level sampling, and various types of chip level sampling. In one embodiment, packaged device 500 provides functionality of system 100, packaged device 300 or packaged device 400—e.g., wherein one or more operations of method 200 are performed with circuitry of packaged device 500.

As shown in FIG. 5, packaged device 500 comprises IC chips 501, 502, and a voltage regulator 550 to provide a first voltage and a second voltage—via interconnect structures 503, 504 (respectively)—to each of IC chips 501, 502. Packaged device 500 further comprises switch circuitry 560 and control circuitry 570 to configure any of multiple modes of switch circuitry 560—e.g., wherein the multiple modes each correspond to different respective one of multiple sample point pairs of interconnect structures 503, 504. In the example embodiment shown, the multiple sample point pairs comprise a sample point pair 505 which is outside of IC chips 501, 502, two sample point pairs 506, 508 which are each at IC chip 501, and two sample point pairs 507, 509 which are each at IC chip 502. The sample point pairs 505, 506, 507, 508, 509 each include a respective first sample point of interconnect structure 503, and a respective second sample point of interconnect structure 504. In one such embodiment, IC chips 501, 502 correspond functionally to IC chips 401, 402—e.g., wherein regulator 550 and control circuitry 570 corresponds functionally to regulator 450 and control circuitry 470 (respectively), and wherein interconnect structures 503, 504 correspond functionally to interconnect structures 403, 404 (respectively).

In various embodiments, packaged device 500 is to couple to—or, for example, includes—a voltage sensor (not shown) which receives sampled voltages via switch circuitry 560 and lines 566 of packaged device 500. For example, switch circuitry 560 is variously coupled between lines 566 and multiple sample point pairs including (for example) the illustrative sample point pairs 505, 506, 507, 508, 509 shown. In an illustrative scenario according to one embodiment, sample point pair 505 is coupled to switch circuitry 560 via lines 561—e.g., wherein sample point pair 506 is coupled to switch circuitry 560 via lines 562. Similarly, sample point pair 507 is coupled to switch circuitry 560 via lines 563—e.g., wherein sample point pair 508 is coupled to switch circuitry 560 via lines 564 and/or sample point pair 509 is coupled to switch circuitry 560 via lines 565. In one such embodiment, multiple modes of switch circuitry 560 each switchedly couple a different respective one (and, for example, only one) of sample point pairs 505, 506, 507, 508, 509 to lines 566. Controller circuitry 570 is coupled to provide one or more control signals 574 which selectively configure a given one of the multiple modes of switch circuitry 560. In an embodiment, the one or more control signals 574 are generated based on control circuitry 570 receiving a signal 572 which specifies or otherwise indicates a workload to be performed with one or both of IC chips 501, 502 based on the first voltage and the second voltage.

In the example embodiment shown, IC chip 501 comprises a first processor which includes processor cores 510 through 517, and integrated voltage regulators IVR 520 through IVR 527 which are each coupled between interconnect structures 503, 504 and a different respective one of cores 510 through 517. Alternatively or in addition, IC chip 502 comprises a second processor which includes processor cores 530 through 537, and integrated voltage regulators IVR 540 through IVR 547 which are each coupled between interconnect structures 503, 504 and a different respective one of cores 530 through 537. In one such embodiment, cores 510 through 517 (or cores 520 through 527) correspond functionally to cores 120$a$, . . . , 120$n$—e.g., wherein IVRs 520-527 (or IVRs 540-547) correspond functionally to IVRs 125$a$, . . . , 125$n$.

In one such embodiment, sample point pair 505 comprises sample points—each at a different respective one of interconnect structures 503, 504—which are between IC chips 501, 502 (e.g., wherein said sample points are outside of any IC chip of packaged device 500). Additionally, or alternatively, cores 510-517 are arranged in a first array—e.g., wherein one or each sample point of sample point pair 506 is at IC chip 501 and is coupled between IC chip 502 and each core of the first array. Additionally, or alternatively, one or each sample point of sample point pair 508 is coupled between two cores (e.g., cores 511, 512) which are in a same row of the first array.

In some embodiments, cores 530-537 are additionally or alternatively arranged in a second array—e.g., wherein one or each sample point of sample point pair 507 is coupled between two cores (for example, cores 530, 534) which are in different respective rows of the second array, and are each in a column at an edge of the second array. In an embodiment, interconnect structure 503 comprises a first portion, which is coupled between the two cores of the second array (e.g., cores 535, 537), and a second portion which branches from the first portion and extends toward another core (e.g., core 536) which is between said two cores. Furthermore, interconnect structure 504 comprises a third portion, which is coupled between the same two cores, and a fourth portion which branches from the third portion and extends toward the other core which is between said two cores. In one such embodiment, sample point pair 509 (for example) includes a sample point at the second portion of interconnect structure 503 and/or a sample point at the fourth portion of interconnect structure 504.

Figure 6:
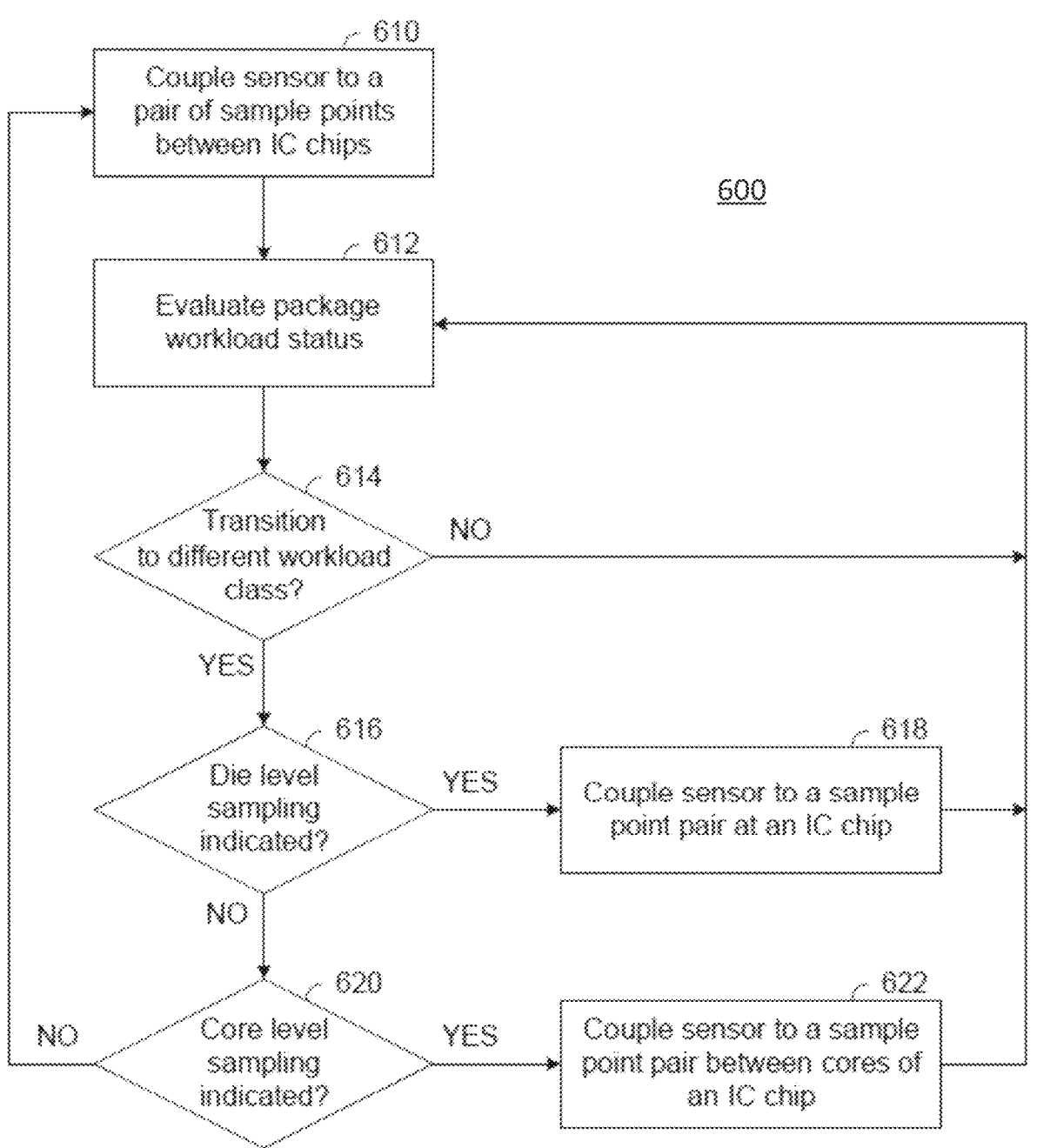
FIG. 6 illustrates a flow diagram showing features of a method to determine a sampling of a voltage differential according to an embodiment.

FIG. 6 shows operations of a method 600 to determine a sampling of a voltage across interconnect structures of a packaged device according to an embodiment. Method 600 is performed, for example, with circuitry of system 100, packaged device 300, packaged device 400, or packaged device 500—e.g., wherein method 200 includes some or all of method 600.

In an embodiment, method 600 determines a mode of switch circuitry (such as switch circuitry 174, switch circuitry 460, or switch circuitry 560) to selectively couple a voltage sensor to a corresponding one of multiple sample point pairs. The sample point pairs each include respective sample points of a first interconnect structure and a second interconnect structure. Such a mode is configured, for example, based on an indication of a workload that is to be performed with some or all of multiple IC chips of a packaged device.

As shown in FIG. 6, method 600 comprises (at 610) providing a first mode of the switch circuitry, where the first mode switchedly couples the voltage sensor to a sample point pair which is between IC chips. For example, in some embodiments, the first mode—e.g., corresponding to sample point pair (P0+, P0−), sample point pair 405, or sample point pair 505—is a default mode which is provided to facilitate a package level voltage sampling during a relatively light (or normal) workload. In some embodiments, method 600 further comprises one or more operations (not shown) to perform such voltage sampling based on the first mode (or, alternatively, based on a different mode of the switch circuitry).

Method 600 further comprises (at 612) performing an evaluation of a current workload status of the packaged device. Such an evaluation is performed, for example, with control circuitry 470 based on signal 472, or with control circuitry 570 based on signal 572. Method 600 further comprises (at 614) determining whether the evaluating at 612 has detected a transition from a current workload class (or an absence of any workload class) to a different class of one or more workload which are being, or are expected to be, performed by the packaged device. Where it is determined at 614 that no such transition is detected, method 600 subsequently performs another evaluation at 612—e.g., wherein package level voltage sampling is performed based on the first switch mode which is provided at 610.

Where it is instead determined at 614 that the packaged device has transitioned (or is expected to transition) to a different class of one or more workloads, method 600 (at 616) performs another evaluation to determine whether the next workload class corresponds to a first type of die level voltage sampling. Where it is determined at 616 that the first type of die level voltage sampling is indicated, method 600 (at 618) provides a second mode of the switch circuitry, which switchedly couples the voltage sensor to a sample point pair at one of the multiple IC chips. By way of illustration and not limitation, the second mode switchedly couples the voltage sensor to sample points—e.g., those of sample point pair 506—which are at the one IC chip, but which are not between any two circuit resources of that IC chip which are of a particular resource type (such as any two cores).

Where it is instead determined at 616 that die level voltage sampling is not indicated, method 600 (at 620) performs another evaluation to determine whether the next workload class corresponds to a second type of die level voltage sampling—referred to as "core level" sampling—at a particular IC chip. Where it is determined at 620 that core level sampling is indicated, method 600 (at 622) provides a third mode of the switch circuitry which switchedly couples the voltage sensor to a sample point pair which is between two components (in this example embodiment, two cores) of an IC chip. By way of illustration and not limitation, the third mode couples the voltage sensor to one of sample point pairs 406, 407, 507, 508, 509, in various embodiments. Where it is instead determined at 620 that core level sampling is not indicated, method 600 configures the first switch mode, which is provided at 610, for package level voltage sampling.

Figure 7:
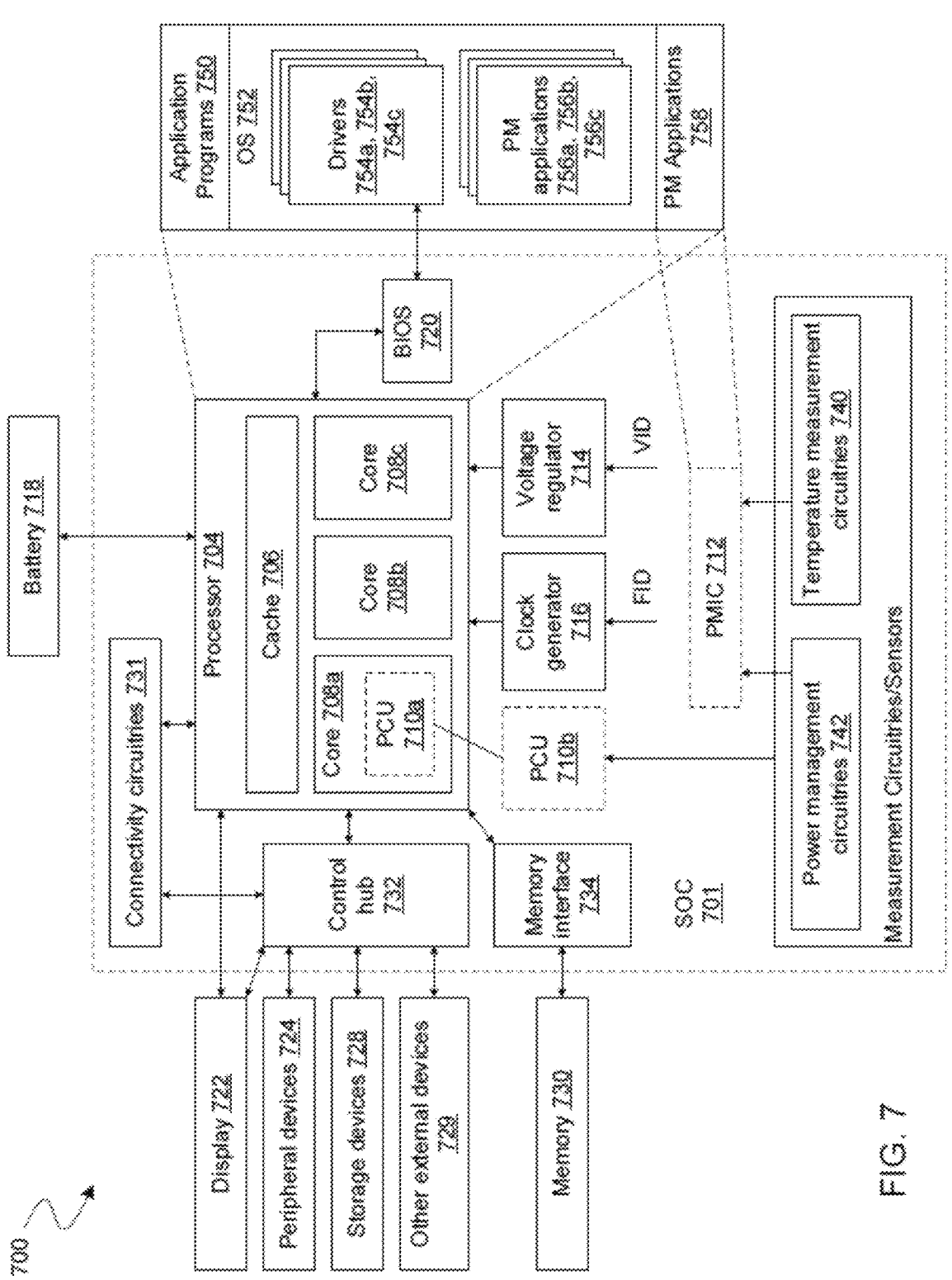
FIG. 7 illustrates a functional block diagram showing features of a computer device according to an embodiment.

FIG. 7 illustrates a computer system or computing device 700 (also referred to as device 700) to variously measure voltages differences across different pairs of sample points at interconnect structures, in accordance with some embodiments. It is pointed out that those elements of FIG. 7 having the same reference numbers (or names) as the elements of any other figure can operate or function in any manner similar to that described, but are not limited to such.

In some embodiments, device 700 represents an appropriate computing device, such as a computing tablet, a mobile phone or smart-phone, a laptop, a desktop, an Internet-of-Things (JOT) device, a server, a wearable device, a set-top box, a wireless-enabled e-reader, or the like. It will be understood that certain components are shown generally, and not all components of such a device are shown in device 700.

In an example, the device 700 comprises a SoC (System-on-Chip) 701. An example boundary of the SOC 701 is illustrated using dotted lines in FIG. 7, with some example components being illustrated to be included within SOC 701—however, SOC 701 may include any appropriate components of device 700.

In some embodiments, device 700 includes processor 704. Processor 704 can include one or more physical devices, such as microprocessors, application processors, microcontrollers, programmable logic devices, processing cores, or other processing means. The processing operations performed by processor 704 include the execution of an operating platform or operating system on which applications and/or device functions are executed. The processing operations include operations related to I/O (input/output) with a human user or with other devices, operations related to power management, operations related to connecting computing device 700 to another device, and/or the like. The processing operations may also include operations related to audio I/O and/or display I/O.

In some embodiments, processor 704 includes multiple processing cores (also referred to as cores) 708a, 708b, 708c. Although merely three cores 708a, 708b, 708c are illustrated in FIG. 7, the processor 704 may include any other appropriate number of processing cores, e.g., tens, or even hundreds of processing cores. Processor cores 708a, 708b, 708c may be implemented on a single integrated circuit (IC) chip. Moreover, the chip may include one or more shared and/or private caches, buses or interconnections, graphics and/or memory controllers, or other components.

In some embodiments, processor 704 includes cache 706. In an example, sections of cache 706 may be dedicated to individual cores 708 (e.g., a first section of cache 706 dedicated to core 708a, a second section of cache 706 dedicated to core 708b, and so on). In an example, one or more sections of cache 706 may be shared among two or more of cores 708. Cache 706 may be split in different levels, e.g., level 1 (L1) cache, level 2 (L2) cache, level 3 (L3) cache, etc.

In some embodiments, a given processor core 708 (for example, core 708a) may include a fetch unit to fetch instructions (including instructions with conditional branches) for execution by the core 708a. The instructions may be fetched from any storage devices such as the memory 730. Processor core 708a may also include a decode unit to decode the fetched instruction. For example, the decode unit may decode the fetched instruction into a plurality of micro-operations. Processor core 708a may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/ or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 708a may be an out-of-order processor core in one embodiment. Processor core 708a may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 708a may also include a bus unit to enable communication between components of the processor core 708a and other components via one or more buses. Processor core 708a may also include one or more registers to store data accessed by various components of the core 708a (such as values related to assigned app priorities and/or sub-system states (modes) association.

In some embodiments, device 700 comprises connectivity circuitries 731. For example, connectivity circuitries 731 includes hardware devices (e.g., wireless and/or wired connectors and communication hardware) and/or software components (e.g., drivers, protocol stacks), e.g., to enable device 700 to communicate with external devices. Device 700 may be separate from the external devices, such as other computing devices, wireless access points or base stations, etc.

In an example, connectivity circuitries 731 may include multiple different types of connectivity. To generalize, the connectivity circuitries 731 may include cellular connectivity circuitries, wireless connectivity circuitries, etc. Cellular connectivity circuitries of connectivity circuitries 731 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UNITS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 731 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 731 may include a network interface, such as a wired or wireless interface, e.g., so that a system embodiment may be incorporated into a wireless device, for example, cell phone or personal digital assistant.

In some embodiments, device 700 comprises control hub 732, which represents hardware devices and/or software components related to interaction with one or more I/O devices. For example, processor 704 may communicate with one or more of display 722, one or more peripheral devices 724, storage devices 728, one or more other external devices 729, etc., via control hub 732. Control hub 732 may be a chipset, a Platform Control Hub (PCH), and/or the like.

For example, control hub 732 illustrates one or more connection points for additional devices that connect to device 700, e.g., through which a user might interact with the system. For example, devices (e.g., devices 729) that can be attached to device 700 include microphone devices, speaker or stereo systems, audio devices, video systems or other display devices, keyboard or keypad devices, or other I/O devices for use with specific applications such as card readers or other devices.

As mentioned above, control hub 732 can interact with audio devices, display 722, etc. For example, input through a microphone or other audio device can provide input or commands for one or more applications or functions of device 700. Additionally, audio output can be provided instead of, or in addition to display output. In another example, if display 722 includes a touch screen, display 722 also acts as an input device, which can be at least partially managed by control hub 732. There can also be additional buttons or switches on computing device 700 to provide I/O functions managed by control hub 732. In one embodiment, control hub 732 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In some embodiments, control hub 732 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 722 represents hardware (e.g., display devices) and software (e.g., drivers) components that provide a visual and/or tactile display for a user to interact with device 700. Display 722 may include a display interface, a display screen, and/or hardware device used to provide a display to a user. In some embodiments, display 722 includes a touch screen (or touch pad) device that provides both output and input to a user. In an example, display 722 may communicate directly with the processor 704. Display 722 can be one or more of an internal display device, as in a mobile electronic device or a laptop device or an external display device attached via a display interface (e.g., DisplayPort, etc.). In one embodiment display 722 can be a head mounted display (HMD) such as a stereoscopic display device for use in virtual reality (VR) applications or augmented reality (AR) applications.

In some embodiments and although not illustrated in the figure, in addition to (or instead of) processor 704, device 700 may include Graphics Processing Unit (GPU) comprising one or more graphics processing cores, which may control one or more aspects of displaying contents on display 722.

Control hub 732 (or platform controller hub) may include hardware interfaces and connectors, as well as software components (e.g., drivers, protocol stacks) to make peripheral connections, e.g., to peripheral devices 724.

It will be understood that device 700 could both be a peripheral device to other computing devices, as well as have peripheral devices connected to it. Device 700 may have a "docking" connector to connect to other computing devices for purposes such as managing (e.g., downloading and/or uploading, changing, synchronizing) content on device 700. Additionally, a docking connector can allow device 700 to connect to certain peripherals that allow computing device 700 to control content output, for example, to audiovisual or other systems.

In addition to a proprietary docking connector or other proprietary connection hardware, device 700 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 731 may be coupled to control hub 732, e.g., in addition to, or instead of, being coupled directly to the processor 704. In some embodiments, display 722 may be coupled to control hub 732, e.g., in addition to, or instead of, being coupled directly to processor 704.

In some embodiments, device 700 comprises memory 730 coupled to processor 704 via memory interface 734. Memory 730 includes memory devices for storing information in device 700. Memory can include nonvolatile (state does not change if power to the memory device is interrupted) and/or volatile (state is indeterminate if power to the memory device is interrupted) memory devices. Memory device 730 can be a dynamic random access memory (DRAM) device, a static random access memory (SRAM) device, flash memory device, phase-change memory device, or some other memory device having suitable performance to serve as process memory. In one embodiment, memory 730 can operate as system memory for device 700, to store data and instructions for use when the one or more processors 704 executes an application or process. Memory 730 can store application data, user data, music, photos, documents, or other data, as well as system data (whether long-term or temporary) related to the execution of the applications and functions of device 700.

Elements of various embodiments and examples are also provided as a machine-readable medium (e.g., memory 730) for storing the computer-executable instructions (e.g., instructions to implement any other processes discussed herein). The machine-readable medium (e.g., memory 730) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 700 comprises temperature measurement circuitries 740, e.g., for measuring temperature of various components of device 700. In an example, temperature measurement circuitries 740 may be embedded, or coupled or attached to various components, whose temperature are to be measured and monitored. For example, temperature measurement circuitries 740 may measure temperature of (or within) one or more of cores 708a, 708b, 708c, voltage regulator 714, memory 730, a mother-board of SOC 701, and/or any appropriate component of device 700.

In some embodiments, device 700 comprises power measurement circuitries 742, e.g., for measuring power consumed by one or more components of the device 700. In an example, in addition to, or instead of, measuring power, the power measurement circuitries 742 may measure voltage and/or current. In an example, the power measurement circuitries 742 may be embedded, or coupled or attached to various components, whose power, voltage, and/or current consumption are to be measured and monitored. For example, power measurement circuitries 742 may measure power, current and/or voltage supplied by one or more voltage regulators 714, power supplied to SOC 701, power supplied to device 700, power consumed by processor 704 (or any other component) of device 700, etc.

In some embodiments, device 700 comprises one or more voltage regulator circuitries, generally referred to as voltage regulator (VR) 714. VR 714 generates signals at appropriate voltage levels, which may be supplied to operate any appropriate components of the device 700. Merely as an example, VR 714 is illustrated to be supplying signals to processor 704 of device 700. In some embodiments, VR 714 receives one or more Voltage Identification (VID) signals, and generates the voltage signal at an appropriate level, based on the VID signals. Various type of VRs may be utilized for the VR 714. For example, VR 714 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 710a/b and/or PMIC 712. In some embodiments, each core has a network of distributed LDOs to provide efficient control for power management. The LDOs can be digital, analog, or a combination of digital or analog LDOs.

In some embodiments, device 700 comprises one or more clock generator circuitries, generally referred to as clock generator 716. Clock generator 716 generates clock signals at appropriate frequency levels, which may be supplied to any appropriate components of device 700. Merely as an example, clock generator 716 is illustrated to be supplying clock signals to processor 704 of device 700. In some embodiments, clock generator 716 receives one or more Frequency Identification (FID) signals, and generates the clock signals at an appropriate frequency, based on the FID signals.

In some embodiments, device 700 comprises battery 718 supplying power to various components of device 700. Merely as an example, battery 718 is illustrated to be supplying power to processor 704. Although not illustrated in the figures, device 700 may comprise a charging circuitry, e.g., to recharge the battery, based on Alternating Current (AC) power supply received from an AC adapter.

In some embodiments, device 700 comprises Power Control Unit (PCU) 710 (also referred to as Power Management Unit (PMU), Power Controller, etc.). In an example, some sections of PCU 710 may be implemented by one or more processing cores 708, and these sections of PCU 710 are symbolically illustrated using a dotted box and labelled PCU 710a. In an example, some other sections of PCU 710 may be implemented outside the processing cores 708, and these sections of PCU 710 are symbolically illustrated using a dotted box and labelled as PCU 710b. PCU 710 may implement various power management operations for device 700. PCU 710 may include hardware interfaces, hardware circuitries, connectors, registers, etc., as well as software components (e.g., drivers, protocol stacks), to implement various power management operations for device 700.

In some embodiments, device 700 comprises Power Management Integrated Circuit (PMIC) 712, e.g., to implement various power management operations for device 700. In some embodiments, PMIC 712 is a Reconfigurable Power Management ICs (RPMICs) and/or an IMVP (Intel® Mobile Voltage Positioning). In an example, the PMIC is within an IC chip separate from processor 704. The may implement various power management operations for device 700. PMIC 712 may include hardware interfaces, hardware circuitries, connectors, registers, etc., as well as software components (e.g., drivers, protocol stacks), to implement various power management operations for device 700.

In an example, device 700 comprises one or both PCU 710 or PMIC 712. In an example, any one of PCU 710 or PMIC 712 may be absent in device 700, and hence, these components are illustrated using dotted lines.

Various power management operations of device 700 may be performed by PCU 710, by PMIC 712, or by a combination of PCU 710 and PMIC 712. For example, PCU 710 and/or PMIC 712 may select a power state (e.g., P-state) for various components of device 700. For example, PCU 710 and/or PMIC 712 may select a power state (e.g., in accordance with the ACPI (Advanced Configuration and Power Interface) specification) for various components of device 700. Merely as an example, PCU 710 and/or PMIC 712 may cause various components of the device 700 to transition to a sleep state, to an active state, to an appropriate C state (e.g., CO state, or another appropriate C state, in accordance with the ACPI specification), etc. In an example, PCU 710 and/or PMIC 712 may control a voltage output by VR 714 and/or a frequency of a clock signal output by the clock generator, e.g., by outputting the VID signal and/or the FID signal, respectively. In an example, PCU 710 and/or PMIC 712 may control battery power usage, charging of battery 718, and features related to power saving operation.

The clock generator 716 can comprise a phase locked loop (PLL), frequency locked loop (FLL), or any suitable clock source. In some embodiments, each core of processor 704 has its own clock source. As such, each core can operate at a frequency independent of the frequency of operation of the other core. In some embodiments, PCU 710 and/or PMIC 712 performs adaptive or dynamic frequency scaling or adjustment. For example, clock frequency of a processor core can be increased if the core is not operating at its maximum power consumption threshold or limit. In some embodiments, PCU 710 and/or PMIC 712 determines the operating condition of each core of a processor, and opportunistically adjusts frequency and/or power supply voltage of that core without the core clocking source (e.g., PLL of that core) losing lock when the PCU 710 and/or PMIC 712 determines that the core is operating below a target performance level. For example, if a core is drawing current from a power supply rail less than a total current allocated for that core or processor 704, then PCU 710 and/or PMIC 712 can temporarily increase the power draw for that core or processor 704 (e.g., by increasing clock frequency and/or power supply voltage level) so that the core or processor 704 can perform at a higher performance level. As such, voltage and/or frequency can be increased temporality for processor 704 without violating product reliability.

In an example, PCU 710 and/or PMIC 712 may perform power management operations, e.g., based at least in part on receiving measurements from power measurement circuitries 742, temperature measurement circuitries 740, charge level of battery 718, and/or any other appropriate information that may be used for power management. To that end, PMIC 712 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 710 and/or PMIC 712 in at least one embodiment to allow PCU 710 and/or PMIC 712 to manage processor core energy at least in part based on value(s) detected by one or more of the sensors.

Also illustrated is an example software stack of device 700 (although not all elements of the software stack are illustrated). Merely as an example, processors 704 may execute application programs 750, Operating System 752, one or more Power Management (PM) specific application programs (e.g., generically referred to as PM applications 758), and/or the like. PM applications 758 may also be executed by the PCU 710 and/or PMIC 712. OS 752 may also include one or more PM applications 756a, 756b, 756c.

The OS 752 may also include various drivers 754*a*, 754*b*, 754*c*, etc., some of which may be specific for power management purposes. In some embodiments, device 700 may further comprise a Basic Input/Output System (BIOS) 720. BIOS 720 may communicate with OS 752 (e.g., via one or more drivers 754), communicate with processors 704, etc.

For example, one or more of PM applications 758, 756, drivers 754, BIOS 720, etc. may be used to implement power management specific tasks, e.g., to control voltage and/or frequency of various components of device 700, to control wake-up state, sleep state, and/or any other appropriate power state of various components of device 700, control battery power usage, charging of the battery 718, features related to power saving operation, etc.

In some embodiments, device 700 comprises a packaged device which includes multiple IC chips (e.g., including SOC 701). In one such embodiment, switch circuitry (not shown) of the packaged device is operable—e.g., with PMIC 712, power measurement circuitries 742, PM applications 758 and/or the like—to selectively provide any of multiple modes which each correspond to a different respective sample point pair. For example, a first interconnect structure and a second interconnect structure of packaged device 700 variously provide a first voltage and a second voltage (respectively) to each of the multiple IC chips. The sample point pairs each include a respective first sample point of the first interconnect structure and a respective second sample point of the second interconnect structure. In response to an indication of a workload to be performed with some or all of the multiple IC chips, some embodiments operate the switch circuitry to selectively couple a voltage sensor to a corresponding sample point pair.

In one or more first embodiments, a packaged device comprises a first interconnect structure and a second interconnect structure coupled to provide a first voltage and a second voltage, respectively, to each of multiple integrated circuit (IC) chips, switch circuitry to be coupled between a voltage sensor and sample point pairs which each comprise a respective first sample point of the first interconnect structure, and a respective second sample point of the second interconnect structure, and controller circuitry, coupled to the switch circuitry, to receive an indication of a workload to be performed with the multiple IC chips based on the first voltage and the second voltage, and based on the indication, to select a first mode of multiple modes of the switch circuitry, the multiple modes each to switchedly couple the voltage sensor to a different respective one of the sample point pairs, and signal the switch circuitry to provide the first mode, wherein the voltage sensor is to detect a difference between the first voltage and the second voltage based on the first mode.

In one or more second embodiments, further to the first embodiment, the sample point pairs comprise a first sample point pair comprising a respective sample point which is outside of each of the multiple IC chips, and a second sample point pair comprising a respective sample point which is at a first IC chip of the multiple IC chips.

In one or more third embodiments, further to the second embodiment, the sample point pairs further comprise a third sample point pair comprising a respective sample point which is at a second IC chip of the multiple IC chips.

In one or more fourth embodiments, further to the first embodiment or the second embodiment, the multiple IC chips comprise a first IC chip and a second IC chip, wherein the first IC chip comprises processor cores, and wherein the sample point pairs comprise a first sample point pair, wherein the respective first sample point of the first sample point pair is at the first IC chip, and is at a location of the first interconnect structure which is between the second IC chip and each processor core of the first IC chip, and a second sample point pair comprising a respective sample point which is at a location of the first interconnect structure which is between two processor cores of the first IC chip.

In one or more fifth embodiments, further to the fourth embodiment, the sample point pairs further comprise a third sample point pair comprising a respective sample point which is outside of each of the multiple IC chips.

In one or more sixth embodiments, further to the first embodiment or the second embodiment, the multiple IC chips comprise a first IC chip comprises processor cores arranged in an array.

In one or more seventh embodiments, further to the sixth embodiment, the sample point pairs comprise a first sample point pair, wherein the respective first sample point of the first sample point pair is at a portion of the first interconnect structure which is coupled between two cores of the array, wherein the two cores are in different respective rows of the array, and are each in a column at an edge of the array.

In one or more eighth embodiments, further to the sixth embodiment, the sample point pairs comprise a first sample point pair, wherein the respective first sample point of the first sample point pair is at a portion of the first interconnect structure which is coupled between two cores of the array, wherein the two cores are each in a row of the array.

In one or more ninth embodiments, further to the first embodiment or the second embodiment, the controller circuitry to select the first mode based on the indication comprises the controller circuitry to identify the workload, based on the indication, as corresponding to a first workload class, and based on the first workload class, access reference information which corresponds multiple workload classes each with a respective one or more modes of the multiple modes.

In one or more tenth embodiments, further to the ninth embodiment, the reference information identifies the first workload class as corresponding to a sequence of two or more modes of the multiple modes, and wherein, based on the indication the controller circuitry is to signal the switch circuitry to successively provide the two or more modes according to the sequence, wherein for each of the two or more modes, the voltage sensor is to detect a respective difference between the first voltage and the second voltage based on the mode.

In one or more eleventh embodiments, a system comprises a packaged device comprising a first interconnect structure and a second interconnect structure coupled to provide a first voltage and a second voltage, respectively, to each of multiple integrated circuit (IC) chips, switch circuitry to be coupled between a voltage sensor and sample point pairs which each comprise a respective first sample point of the first interconnect structure, and a respective second sample point of the second interconnect structure, and controller circuitry, coupled to the switch circuitry, to receive an indication of a workload to be performed with the multiple IC chips based on the first voltage and the second voltage, and based on the indication, to select a first mode of multiple modes of the switch circuitry, the multiple modes each to switchedly couple the voltage sensor to a different respective one of the sample point pairs, and signal the switch circuitry to provide the first mode, wherein the voltage sensor is to detect a difference between the first voltage and the second voltage based on the first mode. The system further comprises a display device coupled to the packaged device, the display device to display an image based on a signal communicated with the packaged device.

In one or more twelfth embodiments, further to the eleventh embodiment, the sample point pairs comprise a first sample point pair comprising a respective sample point which is outside of each of the multiple IC chips, and a second sample point pair comprising a respective sample point which is at a first IC chip of the multiple IC chips.

In one or more thirteenth embodiments, further to the twelfth embodiment, the sample point pairs further comprise a third sample point pair comprising a respective sample point which is at a second IC chip of the multiple IC chips.

In one or more fourteenth embodiments, further to the eleventh embodiment or the twelfth embodiment, the multiple IC chips comprise a first IC chip and a second IC chip, wherein the first IC chip comprises processor cores, and wherein the sample point pairs comprise a first sample point pair, wherein the respective first sample point of the first sample point pair is at the first IC chip, and is at a location of the first interconnect structure which is between the second IC chip and each processor core of the first IC chip, and a second sample point pair comprising a respective sample point which is at a location of the first interconnect structure which is between two processor cores of the first IC chip.

In one or more fifteenth embodiments, further to the fourteenth embodiment, the sample point pairs further comprise a third sample point pair comprising a respective sample point which is outside of each of the multiple IC chips.

In one or more sixteenth embodiments, further to the eleventh embodiment or the twelfth embodiment, the multiple IC chips comprise a first IC chip comprising processor cores arranged in an array.

In one or more seventeenth embodiments, further to the sixteenth embodiment, the sample point pairs comprise a first sample point pair, wherein the respective first sample point of the first sample point pair is at a portion of the first interconnect structure which is coupled between two cores of the array, wherein the two cores are in different respective rows of the array, and are each in a column at an edge of the array.

In one or more eighteenth embodiments, further to the sixteenth embodiment, the sample point pairs comprise a first sample point pair, wherein the respective first sample point of the first sample point pair is at a portion of the first interconnect structure which is coupled between two cores of the array, wherein the two cores are each in a row of the array.

In one or more nineteenth embodiments, further to the eleventh embodiment or the twelfth embodiment, the controller circuitry to select the first mode based on the indication comprises the controller circuitry to identify the workload, based on the indication, as corresponding to a first workload class, and based on the first workload class, access reference information which corresponds multiple workload classes each with a respective one or more modes of the multiple modes.

In one or more twentieth embodiments, further to the nineteenth embodiment, the reference information identifies the first workload class as corresponding to a sequence of two or more modes of the multiple modes, and wherein, based on the indication the controller circuitry is to signal the switch circuitry to successively provide the two or more modes according to the sequence, wherein for each of the two or more modes, the voltage sensor is to detect a respective difference between the first voltage and the second voltage based on the mode.

In one or more twenty-first embodiments, a method at a packaged device comprises receiving an indication of a workload to be performed with multiple integrated circuit (IC) chips based on a first voltage and a second voltage which are provided, via a first interconnect structure and a second interconnect structure respectively, to each of the multiple IC chips, wherein switch circuitry is coupled between a voltage sensor and sample point pairs which each comprise a respective first sample point of the first interconnect structure, and a respective second sample point of the second interconnect structure, and based on the indication selecting a first mode of multiple modes of the switch circuitry, the multiple modes each to switchedly couple the voltage sensor to a different respective one of the sample point pairs, providing the first mode to enable a conductive path between the voltage sensor and a first sample point pair of the sample point pairs, wherein the voltage sensor detects a difference between the first voltage and the second voltage based on the first mode.

In one or more twenty-second embodiments, further to the twenty-first embodiment, the sample point pairs comprise a first sample point pair comprising a respective sample point which is outside of each of the multiple IC chips, and a second sample point pair comprising a respective sample point which is at a first IC chip of the multiple IC chips.

In one or more twenty-third embodiments, further to the twenty-second embodiment, the sample point pairs further comprise a third sample point pair comprising a respective sample point which is at a second IC chip of the multiple IC chips.

In one or more twenty-fourth embodiments, further to the twenty-first embodiment or the twenty-second embodiment, the multiple IC chips comprise a first IC chip and a second IC chip, wherein the first IC chip comprises processor cores, and wherein the sample point pairs comprise a first sample point pair, wherein the respective first sample point of the first sample point pair is at the first IC chip, and is at a location of the first interconnect structure which is between the second IC chip and each processor core of the first IC chip, and a second sample point pair comprising a respective sample point which is at a location of the first interconnect structure which is between two processor cores of the first IC chip.

In one or more twenty-fifth embodiments, further to the twenty-fourth embodiment, the sample point pairs further comprise a third sample point pair comprising a respective sample point which is outside of each of the multiple IC chips.

In one or more twenty-sixth embodiments, further to the twenty-first embodiment or the twenty-second embodiment, the multiple IC chips comprise a first IC chip comprising processor cores arranged in an array.

In one or more twenty-seventh embodiments, further to the twenty-sixth embodiment, the sample point pairs comprise a first sample point pair, wherein the respective first sample point of the first sample point pair is at a portion of the first interconnect structure which is coupled between two cores of the array, wherein the two cores are in different respective rows of the array, and are each in a column at an edge of the array.

In one or more twenty-eighth embodiments, further to the twenty-sixth embodiment, the sample point pairs comprise a first sample point pair, wherein the respective first sample point of the first sample point pair is at a portion of the first interconnect structure which is coupled between two cores of the array, wherein the two cores are each in a row of the array.

In one or more twenty-ninth embodiments, further to the twenty-first embodiment or the twenty-second embodiment, selecting the first mode based on the indication comprises identifying the workload, based on the indication, as corresponding to a first workload class, and based on the first workload class, accessing reference information which corresponds multiple workload classes each with a respective one or more modes of the multiple modes.

In one or more thirtieth embodiments, further to the twenty-ninth embodiment, the reference information identifies the first workload class as corresponding to a sequence of two or more modes of the multiple modes, and wherein, based on the indication the switch circuitry is controlled to successively provide the two or more modes according to the sequence, wherein for each of the two or more modes, the voltage sensor detects a respective difference between the first voltage and the second voltage based on the mode.

In one or more thirty-first embodiments, a packaged device comprises multiple integrated circuit (IC) chips, a voltage regulator coupled to provide to a first voltage and a second voltage, via a first interconnect structure and a second interconnect structure, respectively, to each of the multiple IC chips, a voltage sensor, switch circuitry coupled between the voltage sensor and sample point pairs which each comprise a respective first sample point of the first interconnect structure, and a respective second sample point of the second interconnect structure, and controller circuitry, coupled to the switch circuitry, to select a first mode of multiple modes of the switch circuitry, the multiple modes each to switchedly couple the voltage sensor to a different respective one of the sample point pairs, and signal the switch circuitry to provide the first mode, wherein the voltage sensor is to detect a difference between the first voltage and the second voltage based on the first mode.

In one or more thirty-second embodiments, further to the thirty-first embodiment, the sample point pairs comprise a first sample point pair comprising a respective sample point which is outside of each of the multiple IC chips, and a second sample point pair comprising a respective sample point which is at a first IC chip of the multiple IC chips.

In one or more thirty-third embodiments, further to the thirty-second embodiment, the sample point pairs further comprise a third sample point pair comprising a respective sample point which is at a second IC chip of the multiple IC chips.

In one or more thirty-fourth embodiments, further to the thirty-first embodiment or the thirty-second embodiment, the multiple IC chips comprise a first IC chip and a second IC chip, wherein the first IC chip comprises processor cores, and wherein the sample point pairs comprise a first sample point pair, wherein the respective first sample point of the first sample point pair is at the first IC chip, and is at a location of the first interconnect structure which is between the second IC chip and each processor core of the first IC chip, and a second sample point pair comprising a respective sample point which is at a location of the first interconnect structure which is between two processor cores of the first IC chip.

In one or more thirty-fifth embodiments, further to the thirty-fourth embodiment, the sample point pairs further comprise a third sample point pair comprising a respective sample point which is outside of each of the multiple IC chips.

In one or more thirty-sixth embodiments, further to the thirty-first embodiment or the thirty-second embodiment, the multiple IC chips comprise a first IC chip comprising processor cores arranged in an array.

In one or more thirty-seventh embodiments, further to the thirty-sixth embodiment, the sample point pairs comprise a first sample point pair, wherein the respective first sample point of the first sample point pair is at a portion of the first interconnect structure which is coupled between two cores of the array, wherein the two cores are in different respective rows of the array, and are each in a column at an edge of the array.

In one or more thirty-eighth embodiments, further to the thirty-sixth embodiment, the sample point pairs comprise a first sample point pair, wherein the respective first sample point of the first sample point pair is at a portion of the first interconnect structure which is coupled between two cores of the array, wherein the two cores are each in a row of the array.

In one or more thirty-ninth embodiments, further to the thirty-first embodiment or the thirty-second embodiment, the controller circuitry to select the first mode comprises the controller circuitry to identify a workload of the multiple IC chips as corresponding to a first workload class, and based on the first workload class, access reference information which corresponds multiple workload classes each with a respective one or more modes of the multiple modes.

In one or more fortieth embodiments, further to the thirty-ninth embodiment, the reference information identifies the first workload class as corresponding to a sequence of two or more modes of the multiple modes, and wherein, based on the indication the controller circuitry is to signal the switch circuitry to successively provide the two or more modes according to the sequence, wherein for each of the two or more modes, the voltage sensor is to detect a respective difference between the first voltage and the second voltage based on the mode.

Techniques and architectures for monitoring power delivery in a packaged device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device comprising:
   a first interconnect structure and a second interconnect structure coupled to provide a first voltage and a second voltage, respectively, to multiple integrated circuit (IC) chips;
   switch circuitry to be coupled between a voltage sensor and sample point pairs which comprise a first sample point of the first interconnect structure, and a second sample point of the second interconnect structure;
   controller circuitry, coupled to the switch circuitry, to receive an indication of a workload to be performed with the multiple IC chips based on the first voltage and the second voltage, and based on the indication, to:
      select a first mode of multiple modes of the switch circuitry, the multiple modes to switchedly couple the voltage sensor to a different respective one of the sample point pairs; and signal the switch circuitry to provide the first mode, wherein the voltage sensor is to detect a difference between the first voltage and the second voltage based on the first mode.

2. The packaged device of claim 1, wherein the sample point pairs comprise:
   a first sample point pair comprising a sample point which is outside of each of the multiple IC chips; and
   a second sample point pair comprising a sample point which is at a first IC chip of the multiple IC chips.

3. The packaged device of claim 2, wherein the sample point pairs further comprise:
   a third sample point pair comprising a sample point which is at a second IC chip of the multiple IC chips.

4. The packaged device of claim 1, wherein the multiple IC chips comprise a first IC chip and a second IC chip, wherein the first IC chip comprises processor cores, and wherein the sample point pairs comprise:
   a first sample point pair, wherein the respective first sample point of the first sample point pair is at the first IC chip, and is at a location of the first interconnect structure which is between the second IC chip and each processor core of the first IC chip; and
   a second sample point pair comprising a respective sample point which is at a location of the first interconnect structure which is between two processor cores of the first IC chip.

5. The packaged device of claim 4, wherein the sample point pairs further comprise:
   a third sample point pair comprising a respective sample point which is outside of each of the multiple IC chips.

6. The packaged device of claim 1, wherein the multiple IC chips comprise a first IC chip comprising processor cores arranged in an array.

7. The packaged device of claim 6, wherein the sample point pairs comprise a first sample point pair, wherein the respective first sample point of the first sample point pair is at a portion of the first interconnect structure which is coupled between two cores of the array, wherein the two cores are in different respective rows of the array, and are each in a column at an edge of the array.

8. The packaged device of claim 6, wherein the sample point pairs comprise a first sample point pair, wherein the respective first sample point of the first sample point pair is at a portion of the first interconnect structure which is coupled between two cores of the array, wherein the two cores are each in a row of the array.

9. The packaged device of claim 1, wherein the controller circuitry to select the first mode based on the indication comprises the controller circuitry to:
   identify the workload, based on the indication, as corresponding to a first workload class; and
   based on the first workload class, access reference information which corresponds multiple workload classes with a respective one or more modes of the multiple modes.

10. The packaged device of claim 9, wherein the reference information identifies the first workload class as corresponding to a sequence of two or more modes of the multiple modes, and wherein, based on the indication:
   the controller circuitry is to signal the switch circuitry to successively provide the two or more modes according to the sequence, wherein for of the two or more modes, the voltage sensor is to detect a difference between the first voltage and the second voltage based on the mode.

11. A system comprising:

a packaged device comprising:

a first interconnect structure and a second interconnect structure coupled to provide a first voltage and a second voltage, respectively, to each of multiple integrated circuit (IC) chips;

switch circuitry to be coupled between a voltage sensor and sample point pairs which each comprise a respective first sample point of the first interconnect structure, and a respective second sample point of the second interconnect structure;

controller circuitry, coupled to the switch circuitry, to receive an indication of a workload to be performed with the multiple IC chips based on the first voltage and the second voltage, and based on the indication, to:

select a first mode of multiple modes of the switch circuitry, the multiple modes each to switchedly couple the voltage sensor to a different respective one of the sample point pairs; and signal the switch circuitry to provide the first mode, wherein the voltage sensor is to detect a difference between the first voltage and the second voltage based on the first mode; and a display device coupled to the packaged device, the display device to display an image based on a signal communicated with the packaged device.

12. The system of claim 11, wherein the sample point pairs comprise:

a first sample point pair comprising a respective sample point which is outside of each of the multiple IC chips; and a second sample point pair comprising a respective sample point which is at a first IC chip of the multiple IC chips.

13. The system of claim 11, wherein the multiple IC chips comprise a first IC chip and a second IC chip, wherein the first IC chip comprises processor cores, and wherein the sample point pairs comprise:

a first sample point pair, wherein the respective first sample point of the first sample point pair is at the first IC chip, and is at a location of the first interconnect structure which is between the second IC chip and each processor core of the first IC chip; and a second sample point pair comprising a respective sample point which is at a location of the first interconnect structure which is between two processor cores of the first IC chip.

14. The system of claim 11, wherein the multiple IC chips comprise a first IC chip comprising processor cores arranged in an array.

15. The system of claim 14, wherein the sample point pairs comprise a first sample point pair, wherein the respective first sample point of the first sample point pair is at a portion of the first interconnect structure which is coupled between two cores of the array, wherein the two cores are each in a row of the array.

16. A packaged device comprising:

multiple integrated circuit (IC) chips;

a voltage regulator coupled to provide to a first voltage and a second voltage, via a first interconnect structure and a second interconnect structure, respectively, to each of the multiple IC chips;

a voltage sensor;

switch circuitry coupled between the voltage sensor and sample point pairs which each comprise a respective first sample point of the first interconnect structure, and a respective second sample point of the second interconnect structure; and controller circuitry, coupled to the switch circuitry, to:

select a first mode of multiple modes of the switch circuitry, the multiple modes each to switchedly couple the voltage sensor to a different respective one of the sample point pairs; and signal the switch circuitry to provide the first mode, wherein the voltage sensor is to detect a difference between the first voltage and the second voltage based on the first mode.

17. The packaged device of claim 16, wherein the sample point pairs comprise:

a first sample point pair comprising a respective sample point which is outside of each of the multiple IC chips; and a second sample point pair comprising a respective sample point which is at a first IC chip of the multiple IC chips.

18. The packaged device of claim 16, wherein the multiple IC chips comprise a first IC chip and a second IC chip, wherein the first IC chip comprises processor cores, and wherein the sample point pairs comprise:

a first sample point pair, wherein the respective first sample point of the first sample point pair is at the first IC chip, and is at a location of the first interconnect structure which is between the second IC chip and each processor core of the first IC chip; and a second sample point pair comprising a respective sample point which is at a location of the first interconnect structure which is between two processor cores of the first IC chip.

19. The packaged device of claim 16, wherein the controller circuitry to select the first mode comprises the controller circuitry to:

identify a workload of the multiple IC chips as corresponding to a first workload class; and based on the first workload class, access reference information which corresponds multiple workload classes each with a respective one or more modes of the multiple modes.

20. The packaged device of claim 19, wherein the reference information identifies the first workload class as corresponding to a sequence of two or more modes of the multiple modes, and wherein, based on the indication:

the controller circuitry is to signal the switch circuitry to successively provide the two or more modes according to the sequence, wherein for each of the two or more modes, the voltage sensor is to detect a respective difference between the first voltage and the second voltage based on the mode.

* * * * *